(12) United States Patent
Endo

(10) Patent No.: US 9,941,859 B2
(45) Date of Patent: Apr. 10, 2018

(54) LADDER-TYPE FILTER, DUPLEXER, AND MODULE

(71) Applicant: TAIYO YUDEN CO., LTD., Tokyo (JP)

(72) Inventor: Yuki Endo, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 14 days.

(21) Appl. No.: 15/099,320

(22) Filed: Apr. 14, 2016

(65) Prior Publication Data
US 2016/0380615 A1    Dec. 29, 2016

(30) Foreign Application Priority Data
Jun. 26, 2015 (JP) .................................. 2015-128230

(51) Int. Cl.
| | |
|---|---|
| *H03H 9/70* | (2006.01) |
| *H03H 9/72* | (2006.01) |
| *H03H 9/54* | (2006.01) |
| *H03H 9/64* | (2006.01) |
| *H03H 9/56* | (2006.01) |
| *H03H 9/60* | (2006.01) |

(52) U.S. Cl.
CPC ............ *H03H 9/725* (2013.01); *H03H 9/542* (2013.01); *H03H 9/568* (2013.01); *H03H 9/605* (2013.01); *H03H 9/6483* (2013.01); *H03H 9/706* (2013.01)

(58) Field of Classification Search
CPC ........ H03H 9/542; H03H 9/568; H03H 9/605; H03H 9/6423; H03H 9/6483; H03H 9/706; H03H 9/725
USPC ................................. 333/133, 189, 193, 196
See application file for complete search history.

(56) References Cited

U.S. PATENT DOCUMENTS

| | | | | |
|---|---|---|---|---|
| 5,933,062 A | * | 8/1999 | Kommrusch ........ | H03H 9/6483 310/313 B |
| 6,208,223 B1 | * | 3/2001 | Shimamura .......... | H03H 9/6483 310/313 B |
| 6,879,224 B2 | * | 4/2005 | Frank ................... | H03H 7/0115 333/189 |

(Continued)

FOREIGN PATENT DOCUMENTS

| | | | |
|---|---|---|---|
| JP | 10-065490 | * | 3/1998 |
| JP | 2001-244704 | * | 9/2001 |

(Continued)

OTHER PUBLICATIONS

Japanese Office Action dated Jan. 23, 2018, in a counterpart Japanese patent application No. 2015-128230. (A machine translation (not reviewed for accuracy) attached.).

*Primary Examiner* — Barbara Summons
(74) *Attorney, Agent, or Firm* — Chen Yoshimura LLP

(57) ABSTRACT

A ladder-type filter includes: one or more series resonators connected in series between an input terminal and an output terminal; one or more parallel resonators connected in parallel between the input terminal and the output terminal; divided parallel resonators formed by serially dividing at least one parallel resonator of the one or more parallel resonators; and an inductor of which a first end is coupled to a first node located in a path from the input terminal to the output terminal through the one or more series resonators, and of which a second end is coupled to a second node located between the divided parallel resonators.

11 Claims, 24 Drawing Sheets

(56) References Cited

U.S. PATENT DOCUMENTS

| | | | |
|---|---|---|---|
| 6,909,338 B2 * | 6/2005 | Omote | H03H 9/542 333/133 |
| 8,188,812 B2 * | 5/2012 | Tanaka | H03H 9/0085 310/313 B |
| 8,279,021 B2 * | 10/2012 | Hara | H03H 9/568 333/133 |
| 2002/0180562 A1 | 12/2002 | Taniguchi | |
| 2004/0058664 A1 * | 3/2004 | Yamamoto | H03H 9/6483 455/339 |
| 2011/0095844 A1 | 4/2011 | Tanaka et al. | |
| 2012/0313726 A1 * | 12/2012 | Ueda | H03H 9/542 333/133 |
| 2015/0022283 A1 | 1/2015 | Watanabe | |

FOREIGN PATENT DOCUMENTS

| | | | |
|---|---|---|---|
| JP | 2002-314372 A | | 10/2002 |
| JP | 2004-135322 | * | 4/2004 |
| JP | 2013-009408 A | | 1/2013 |
| JP | 2014-17537 A | | 1/2014 |
| WO | 2013/154113 A1 | | 10/2013 |

* cited by examiner 2.50 GHz~2.57 GHz

—— FIRST EMBODIMENT
------ FIRST COMPARATIVE EXAMPLE 2.50 GHz~2.57 GHz

—— FIRST EMBODIMENT
------ FIRST COMPARATIVE EXAMPLE

LADDER-TYPE FILTER, DUPLEXER, AND MODULE

CROSS-REFERENCE TO RELATED APPLICATION

This application is based upon and claims the benefit of priority of the prior Japanese Patent Application No. 2015-128230, filed on Jun. 26, 2015, the entire contents of which are incorporated herein by reference.

FIELD

A certain aspect of the present invention relates to a ladder-type filter, a duplexer, and a module.

BACKGROUND

Ladder-type filters have been used in high frequency communication systems. It has been known to connect an inductor between a parallel resonator of a ladder-type filter and ground as disclosed in Japanese Patent Application Publication No. 2002-314372 (Patent Document 1). It has been also known to connect a capacitor between the ground terminal and the serial arm of a parallel resonator as disclosed in Japanese Patent Application Publication No. 2014-17537 (Patent Document 2).

The arts disclosed in Patent Documents 1 and 2 allow an attenuation pole to be formed outside the passband of the ladder-type filter. When an attenuation pole is formed, the loss of the passband and the characteristics including an isolation characteristic are required not to deteriorate before and after the connection of an inductor. For example, if the resonant frequency of a resonator changes due to the addition of the inductor, the characteristics of the ladder-type filter changes.

SUMMARY OF THE INVENTION

According to a first aspect of the present invention, there is provided a ladder-type filter including: one or more series resonators connected in series between an input terminal and an output terminal; one or more parallel resonators connected in parallel between the input terminal and the output terminal; divided parallel resonators formed by serially dividing at least one parallel resonator of the one or more parallel resonators; and an inductor of which a first end is coupled to a first node located in a path from the input terminal to the output terminal through the one or more series resonators, and of which a second end is coupled to a second node located between the divided parallel resonators.

According to a second aspect of the present invention, there is provided a duplexer including: a transmit filter connected between a transmit terminal and a common terminal; and a receive filter connected between a receive terminal and the common terminal, wherein at least one of the transmit filter and the receive filter is the above ladder-type filter.

According to a third aspect of the present invention, there is provided a module including: the above ladder-type filter.

DETAILED DESCRIPTION

Hereinafter, embodiments of the present invention will be described with reference to accompanying drawings.

First Embodiment

Figure 1:
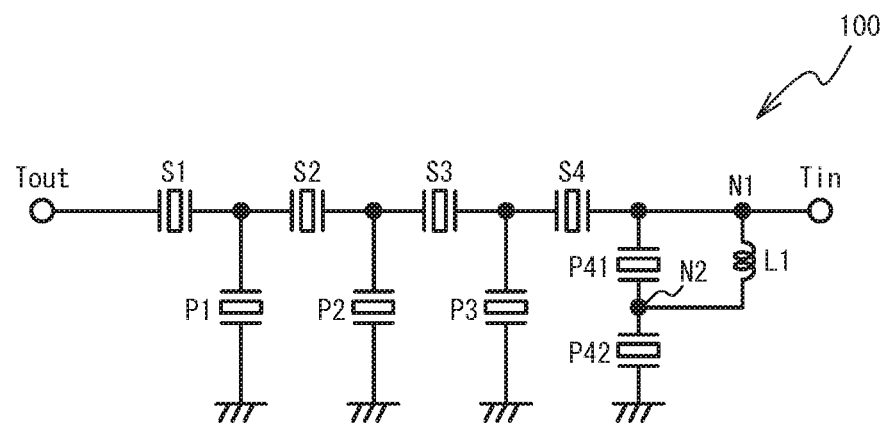
FIG. 1 is a circuit diagram of a filter in accordance with a first embodiment.

FIG. 1 is a circuit diagram of a filter in accordance with a first embodiment. As illustrated in FIG. 1, a filter 100 is a ladder-type filter, and includes one or more series resonators S1 through S4, one or more parallel resonators P1 through P4, and an inductor L1. The series resonators S1 through S4 are connected in series between an input terminal Tin and an output terminal Tout. The parallel resonators P1 through P4 are connected in parallel between the input terminal Tin and the output terminal Tout. The parallel resonator P4 is serially divided into parallel resonators P41 and P42. A first end of the inductor L1 is coupled to a node N1 between the series resonator S4 and the input terminal Tin. A second end of the inductor L1 is coupled to a node N2 between the divided parallel resonators P41 and P42.

Figure 2:
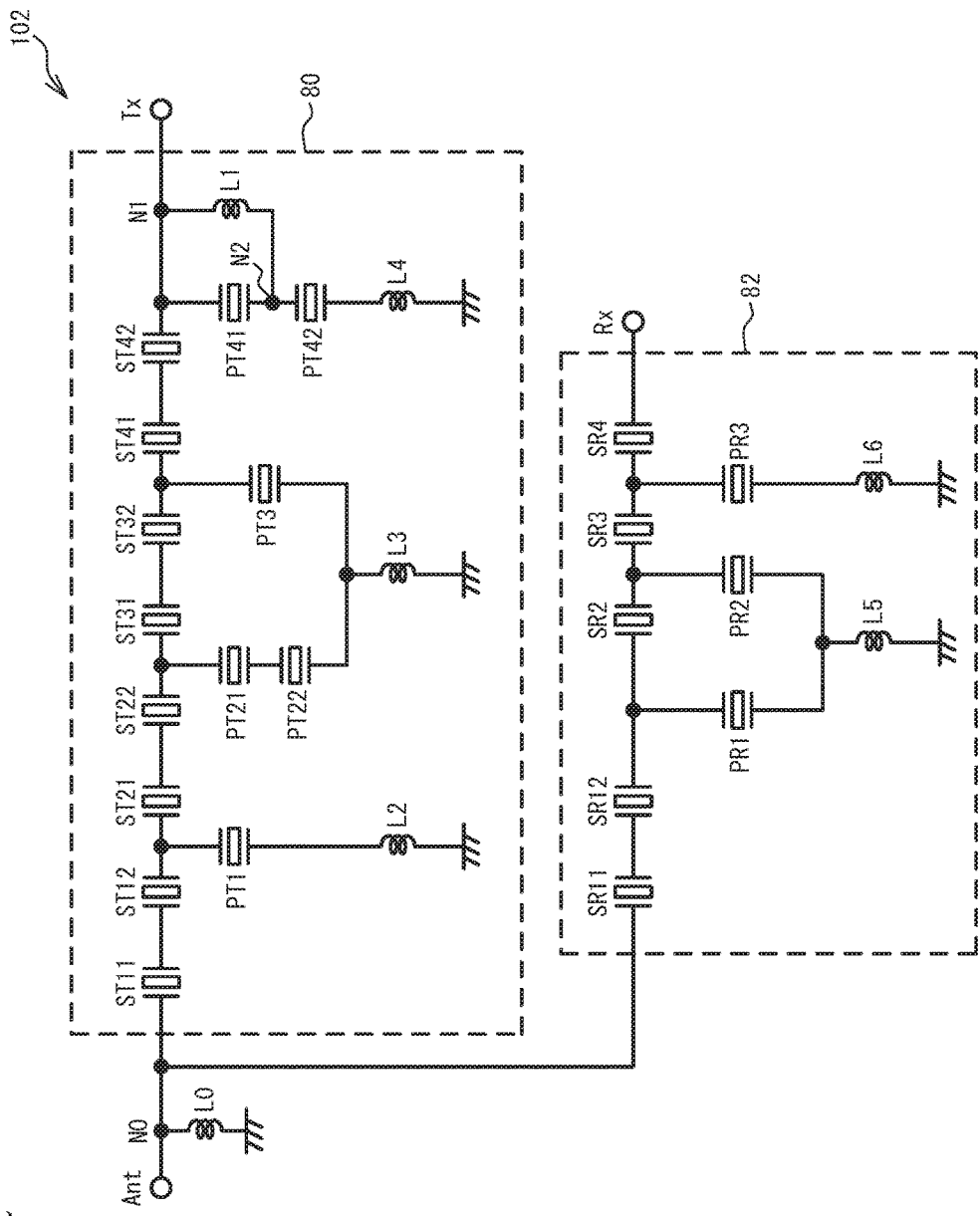
FIG. 2 is a circuit diagram of a duplexer using the filter of the first embodiment.

The characteristics of the filter of the first embodiment were simulated. FIG. 2 is a circuit diagram of a duplexer using the filter of the first embodiment. As illustrated in FIG. 2, a duplexer 102 includes a transmit filter 80 and a receive filter 82. The transmit filter 80 is connected between a common terminal Ant and a transmit terminal Tx. The receive filter 82 is connected between the common terminal Ant and a receive terminal Rx. An inductor L0 is connected between the common terminal Ant and ground. The transmit filter 80 passes signals within the transmit band, among signals input from the transmit terminal Tx, to the common terminal Ant, and suppresses signals in other bands. The receive filter 82 passes signals within the receive band among signals input from the common terminal Ant, and suppresses signals in other bands. The inductor L0 functions as a matching circuit. The duplexer 102 supports band 7, and has a transmit band of 2.50 to 2.57 GHz and a receive band of 2.62 to 2.69 GHz.

The transmit filter 80 corresponds to the filter 100. The series resonators S1 through S4 of the filter 100 are respectively serially divided into series resonators ST11 and ST12, ST21 and ST22, ST31 and ST32, and ST41 and ST42. The parallel resonators PT1 through PT4 respectively correspond to the parallel resonator PT1, divided parallel resonators PT21 and PT22, PT3, and divided parallel resonators PT41 and PT42. The ground terminal of the parallel resonator PT1 is connected to ground through an inductor L2. The ground terminals of the parallel resonators PT22 and PT3 are commonly connected to ground through an inductor L3. The ground terminal of the parallel resonator PT42 is connected to ground through an inductor L4.

The receive filter 82 includes series resonators SR11 through SR4 and parallel resonators PR1 through PR3. The series resonators SR11 through SR4 are connected in series between the common terminal Ant and the receive terminal Rx. The parallel resonators PR1 through PR3 are connected in parallel between the common terminal Ant and the receive terminal Rx. The ground terminals of the parallel resonators PR1 and PR2 are commonly connected to ground through an inductor L5. The ground terminal of the parallel resonator PR3 is connected to ground through an inductor L6.

The series resonators and the parallel resonators were assumed to be surface acoustic wave resonators, and were divided so that divided resonators have the same capacitance value. The inductance of each inductor was configured as L0=4.7 nH, L2=0.3 nH, L3=0.2 nH, L4=0.3 nH, L5=0.1 nH, and L6=0.3 nH. The inductance of the inductor L1 was configured as L1=5.6 nH. As a first comparative example, simulation was also conducted on a duplexer that has the same configuration as that of the first embodiment except that the inductor L1 is not provided.

Figure 3A:
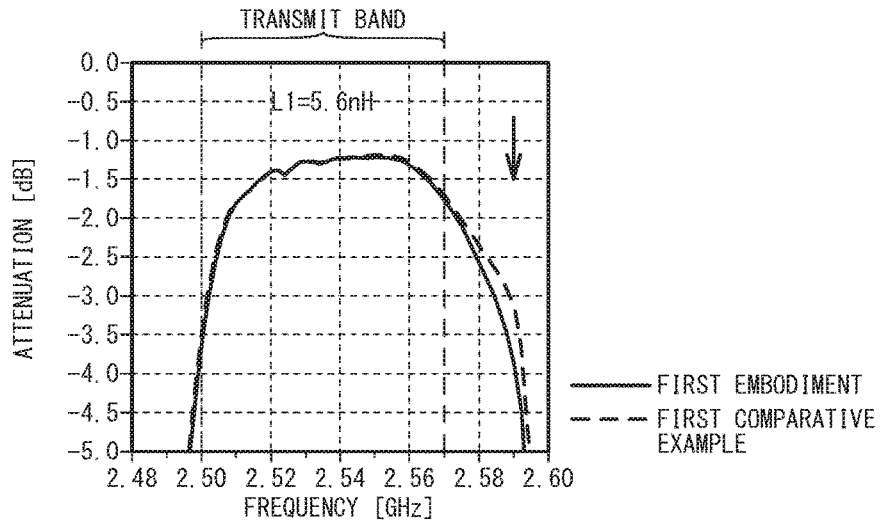
FIG. 3A through FIG. 3C illustrate pass characteristics from a transmit terminal to a common terminal in the first embodiment and a first comparative example.
Figure 3B:
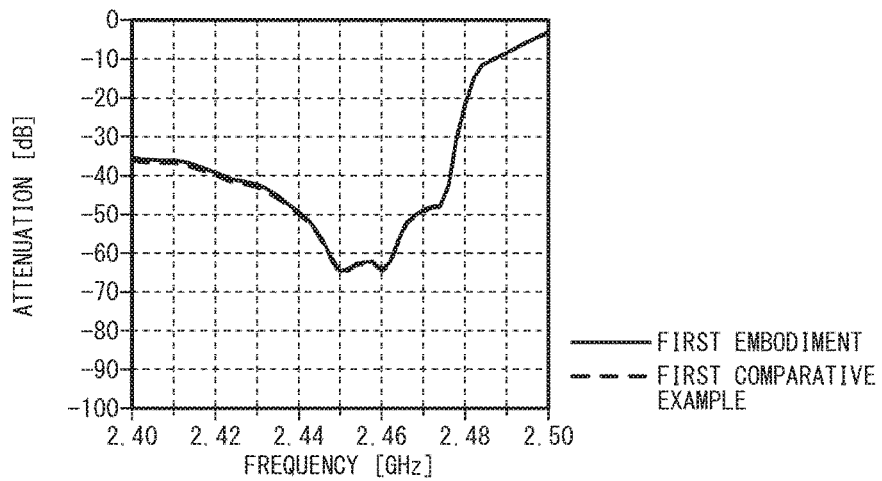
Figure 3C:
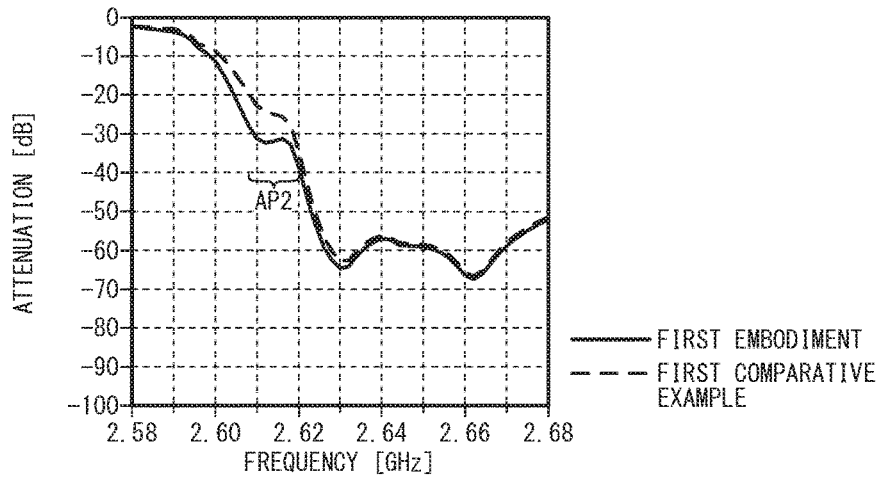
Figure 4A:
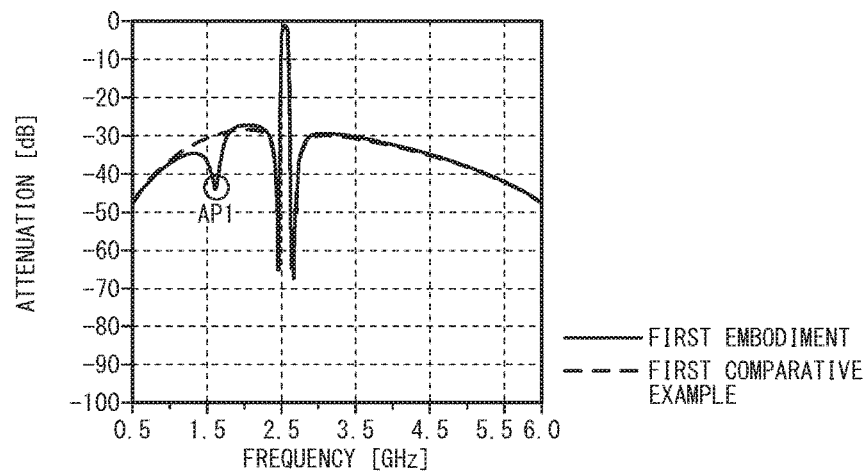
FIG. 4A and FIG. 4B illustrate pass characteristics from the transmit terminal to the common terminal in the first embodiment and the first comparative example.
Figure 4B:
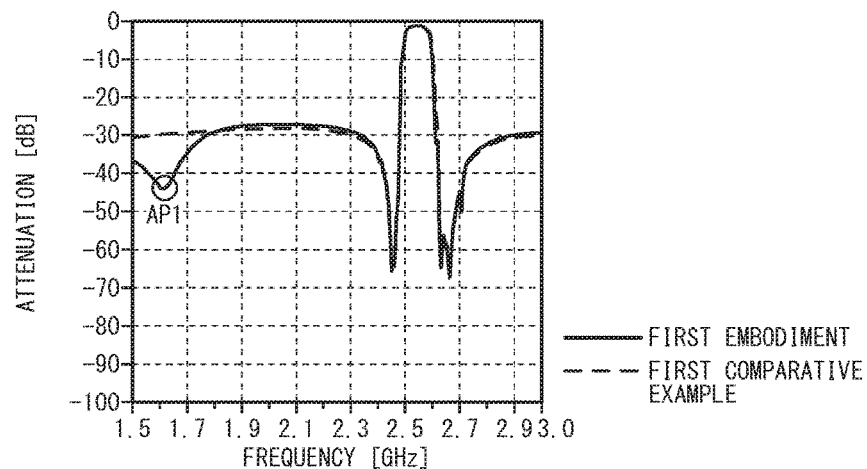

FIG. 3A through FIG. 4B illustrate pass characteristics from the transmit terminal to the common terminal in the first embodiment and the first comparative example. FIG. 4C illustrates isolation characteristics from the transmit terminal to the receive terminal in the first embodiment and the first comparative example. FIG. 3A is an enlarged view around the transmit band, FIG. 3B is an enlarged view near the transmit band (at frequencies lower than the transmit band), and FIG. 3C is an enlarged view near the transmit band (at frequencies higher than the transmit band). FIG. 4A illustrates pass characteristics in a wider band, and FIG. 4B is a view slightly enlarging FIG. 4A. The solid lines indicate the first embodiment, and the dashed lines indicate the first comparative example.

As illustrated in FIG. 3A, the loss of the transmit band is almost the same between the first embodiment and the first comparative example. Near the frequency higher than the transmit band indicated by the arrow, the first embodiment has a larger attenuation than the first comparative example. As illustrated in FIG. 3B, the characteristics at a frequency lower than the transmit band are the same between the first embodiment and the first comparative example.

Figure 4C:
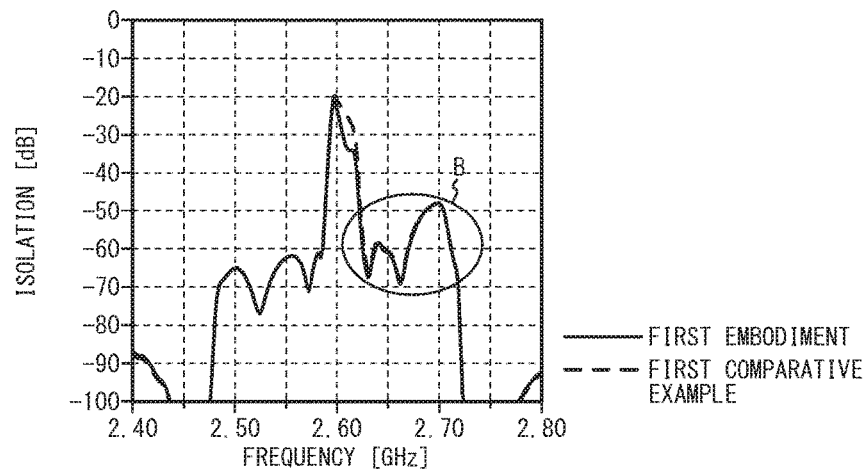
FIG. 4C illustrates isolation characteristics from the transmit terminal to a receive terminal in the first embodiment and the first comparative example.

As illustrated in FIG. 3C, an attenuation pole AP2 is formed at frequencies higher than the transmit band, and the first embodiment has a larger attenuation than the first comparative example. As illustrated in FIG. 4A and FIG. 4B, an attenuation pole AP1 is formed around 1.6 GHz. The attenuation pole AP1 corresponds to the band of GPS (Global Positioning System). The attenuation pole AP1 is a steep attenuation pole. As illustrated in FIG. 4C, the isolation characteristics in a vicinity B of the receive band are the same between the first embodiment and the first comparative example.

Figure 5A:
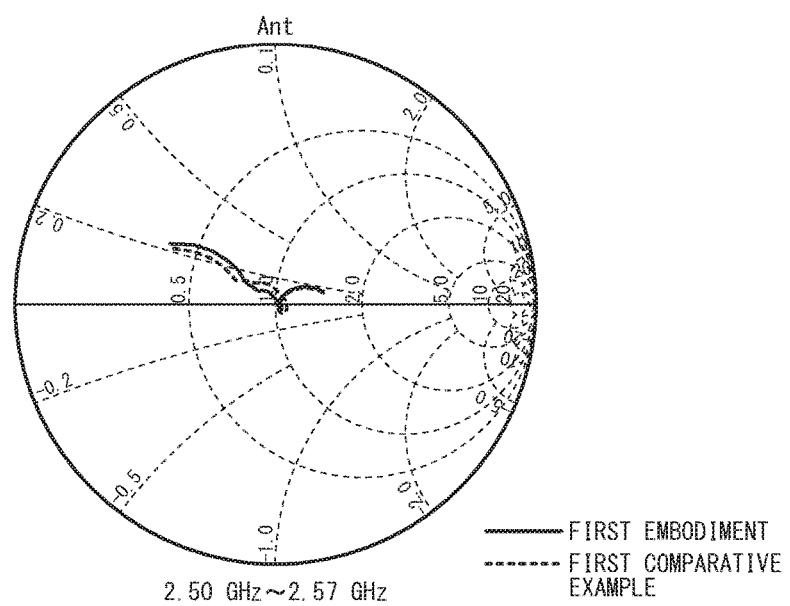
FIG. 5A and FIG. 5B are Smith charts illustrating reflection characteristics in a transmit band in the first embodiment and the first comparative example.
Figure 5B:
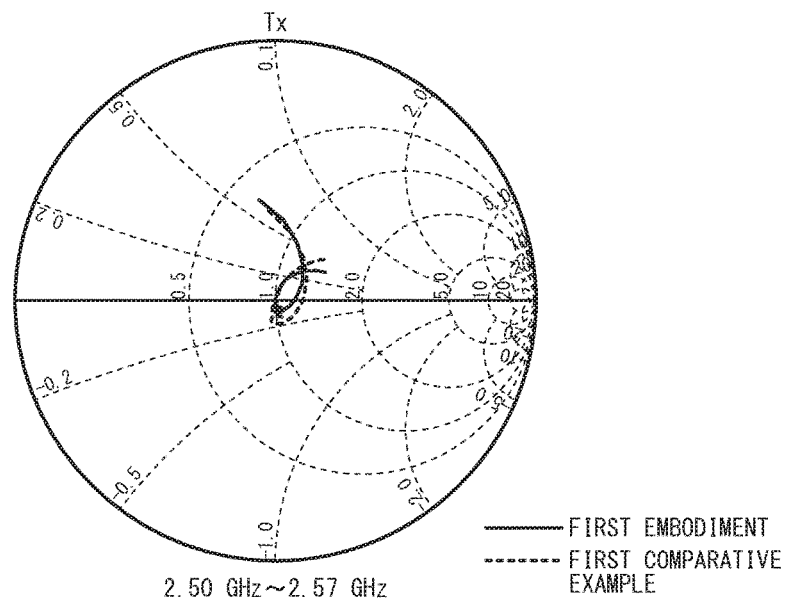

FIG. 5A and FIG. 5B are Smith charts illustrating reflection characteristics in the transmit band in the first embodiment and the first comparative example. FIG. 5A and FIG. 5B respectively illustrate reflection characteristics viewed from the common terminal Ant and reflection characteristics viewed from the transmit terminal Tx. The solid lines indicate the first embodiment, and the dashed lines indicate the first comparative example. As illustrated in FIG. 5A and FIG. 5B, the reflection characteristics in the transmit band are the same between the first embodiment and the first comparative example.

As described above, the first embodiment allows the attenuation pole AP1 with a frequency lower than the passband and the attenuation pole AP2 with a frequency higher than the passband to be formed without deteriorating the pass characteristic of the passband (corresponding to the transmit band) and the isolation characteristic compared to the first comparative example.

Simulation was conducted by varying the inductance of the inductor L1 to 5.6 nH, 4.3 nH, 3.0 nH, and 1.0 nH. FIG.

Figure 6A:
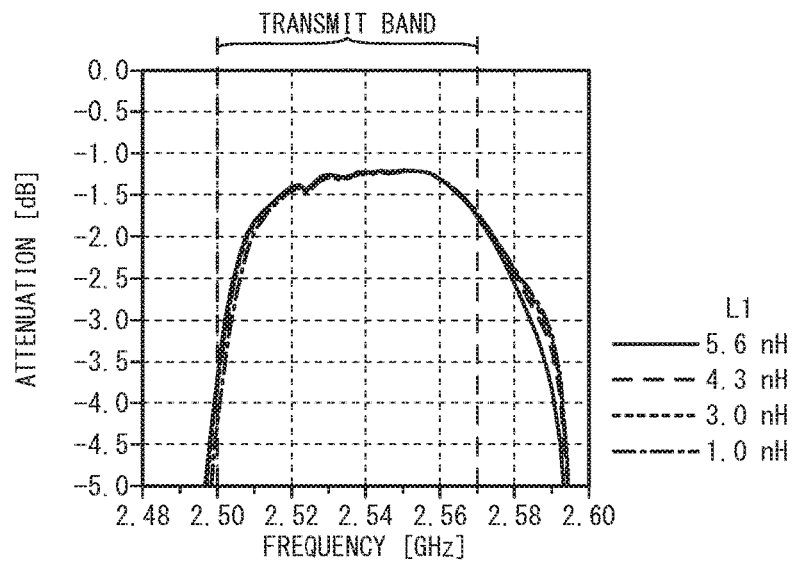
FIG. 6A through FIG. 6C illustrate pass characteristics when the inductance of an inductor L1 is varied in the first embodiment.
Figure 6B:
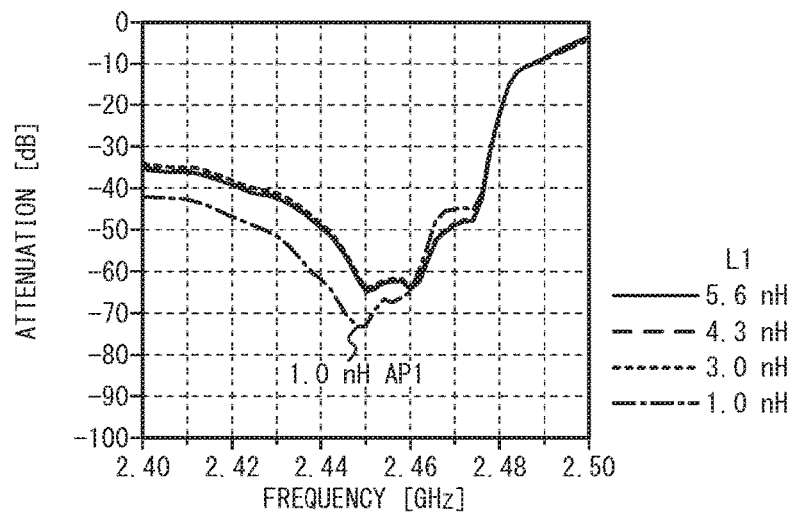
Figure 6C:
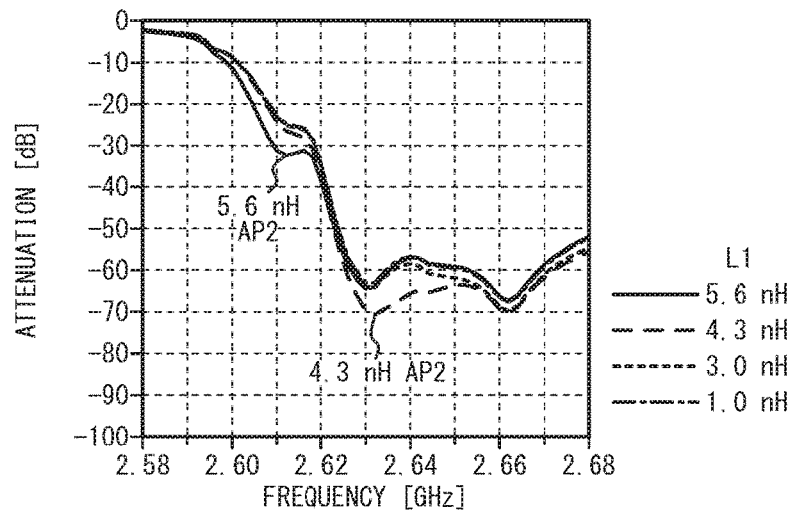
Figure 7A:
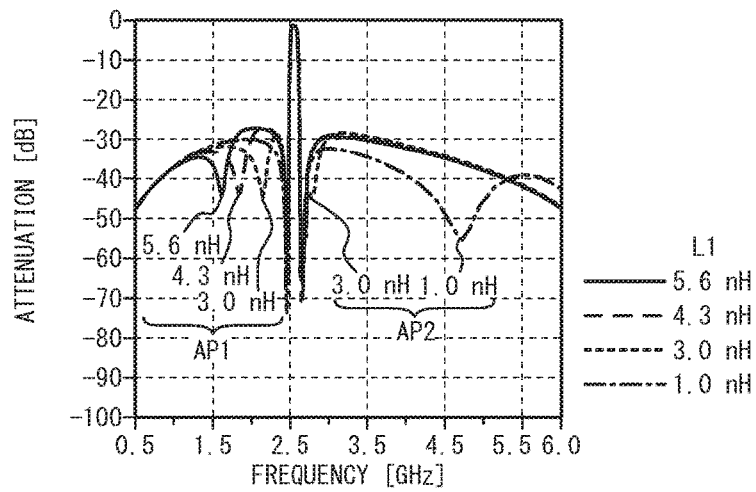
FIG. 7A and FIG. 7B illustrate pass characteristics when the inductance of the inductor L1 is varied in the first embodiment.
Figure 7B:
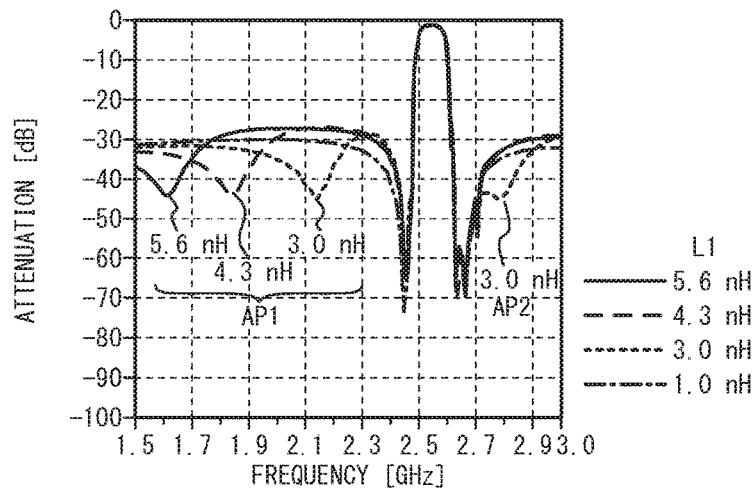
Figure 7C:
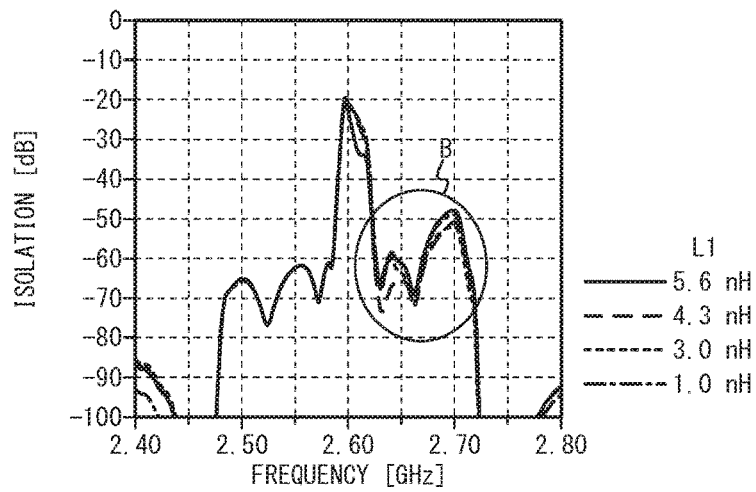
FIG. 7C illustrates isolation characteristics when the inductance of the inductor L1 is varied in the first embodiment.

6A through FIG. 7B illustrate pass characteristics when the inductance of the inductor L1 is varied in the first embodiment. FIG. 7C illustrates isolation characteristics when the inductance of the inductor L1 is varied in the first embodiment. FIG. 6A through FIG. 7C respectively correspond to FIG. 3A through FIG. 4C.

As illustrated in FIG. 6A, even when the inductance of the inductor L1 is varied, the loss of the transmit band remains unchanged. As illustrated in FIG. 7C, the isolation characteristic remains unchanged in the vicinity B of the receive band. As illustrated in FIG. 6B through FIG. 7B, as the inductance of the inductor L1 decreases, the attenuation poles AP1 and AP2 shift to higher frequencies. Accordingly, the attenuation poles AP1 and AP2 are formed at desired frequencies by changing the inductance of the inductor L1.

Figure 8A:
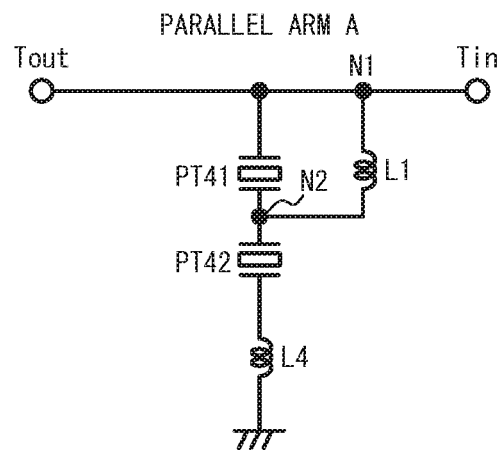
FIG. 8A and FIG. 8B are circuit diagrams of parallel arms A and B, respectively.
Figure 8B:
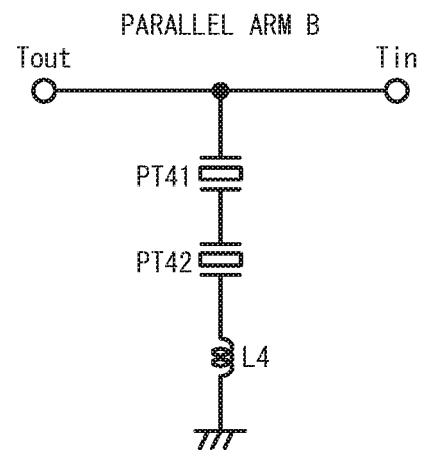

To investigate the reason why the attenuation pole is formed without changing the pass characteristic of the passband and the isolation characteristic in the first embodiment, simulation was conducted by using only the parallel resonators PT41 and PT42, and the inductors L1 and L4. FIG. 8A and FIG. 8B are circuit diagrams of parallel arms A and B, respectively. As illustrated in FIG. 8A, in the parallel arm A, the parallel resonators PT41 and PT42 are connected in parallel between the input terminal Tin and the output terminal Tout. The inductor L1 is connected between the node N1 closer to the input terminal Tin than the parallel resonators PT41 and PT42 and the node N2 between the parallel resonators PT41 and PT42. The inductor L4 is connected between the parallel resonator PT42 and ground.

As illustrated in FIG. 8B, in the parallel arm B, the inductor L1 is not connected. In the parallel arms A and B, the parallel resonators PT41 and PT42, and the inductors L1 and L4 are the same as those of the first embodiment with which FIG. 3A through FIG. 4C were simulated.

Figure 9A:
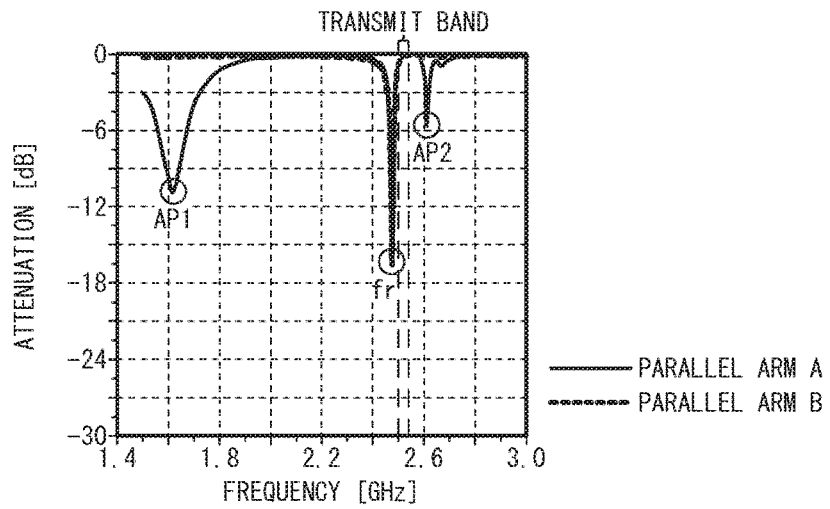
FIG. 9A through FIG. 9C illustrate pass characteristics of the parallel arms A and B.
Figure 9B:
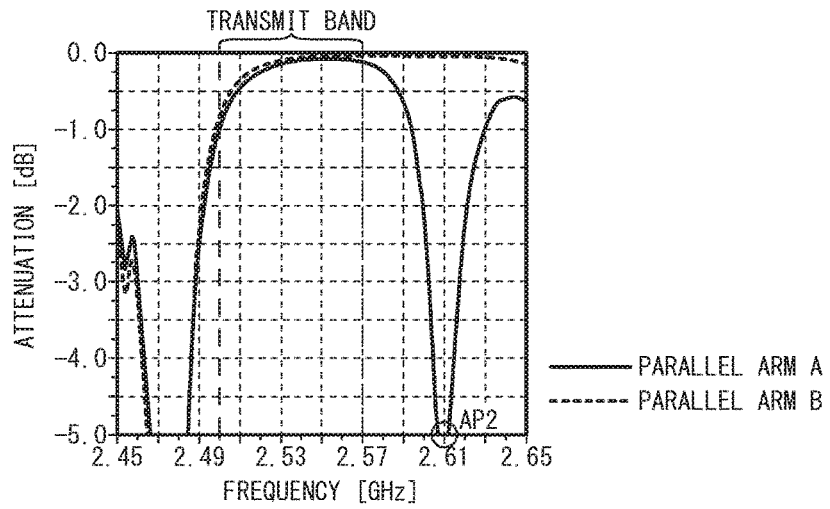
Figure 9C:
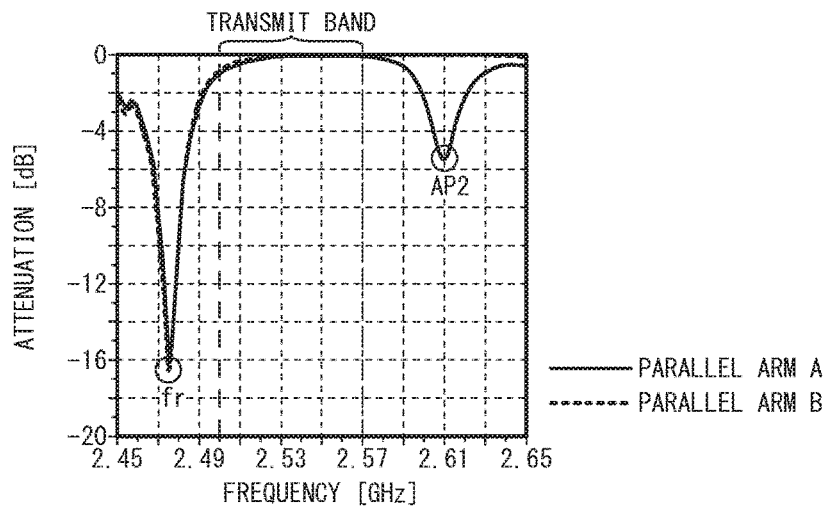

FIG. 9A through FIG. 9C illustrate pass characteristics of the parallel arms A and B. FIG. 9A illustrates pass characteristics from the input terminal Tin to the output terminal Tout in a wide band, FIG. 9B is an enlarged view of the transmit band, and FIG. 9C is an enlarged view of the transmit band and the vicinity of the transmit band.

As illustrated in FIG. 9A through FIG. 9C, a resonant frequency fr of approximately 2.488 GHz is the same between the parallel arms A and B. The parallel arm A allows the attenuation pole AP1 and the attenuation pole AP2 to be respectively formed at approximately 1.6 GHz and approximately 2.61 GHz by providing the inductor L1.

As described above, in the parallel arm A, the addition of the inductor L1 to the parallel arm B allows the attenuation poles AP1 and AP2 to be formed without changing the resonant frequency fr. Since the resonant frequency fr remains unchanged, the first embodiment allows the attenuation poles AP1 and AP2 to be formed without changing the pass characteristic of the passband and the isolation characteristic.

Figure 10A:
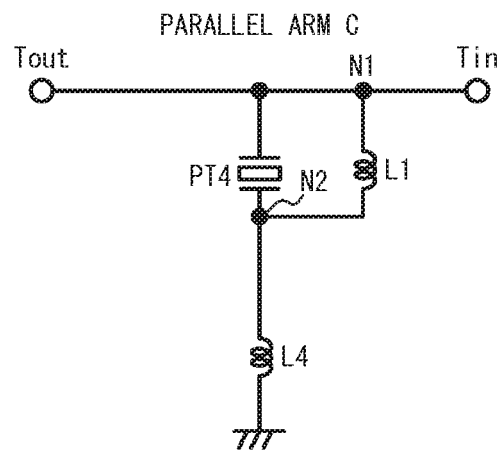
FIG. 10A and FIG. 10B are circuit diagrams of parallel arms C and D, respectively.
Figure 10B:
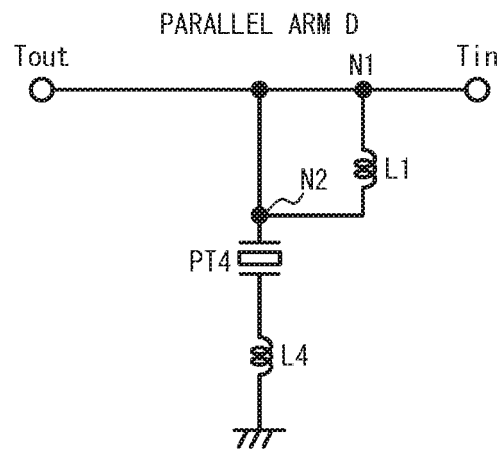

Next, the case where a parallel resonator is not divided was examined. FIG. 10A and FIG. 10B are circuit diagrams of parallel arms C and D. As illustrated in FIG. 10A, in the parallel arm C, the parallel resonator PT4 is not divided. The inductor L1 is located between the node N1 and the node N2 between the parallel resonator PT4 and the inductor L4. As illustrated in FIG. 10B, in the parallel arm D, the parallel resonator PT4 is not divided. The inductor L1 is located between the node N1 and the node N2 located at the input terminal Tin side of the parallel resonator PT4.

Figure 11A:
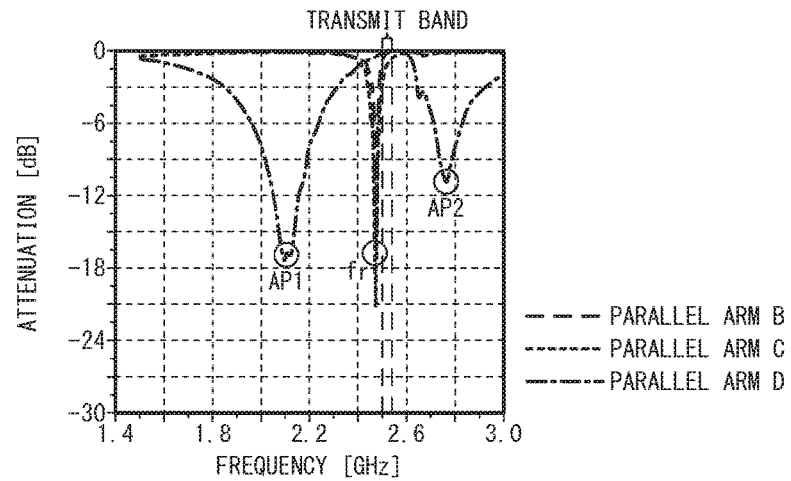
FIG. 11A through FIG. 11C illustrate pass characteristics of the parallel arms B through D.
Figure 11B:
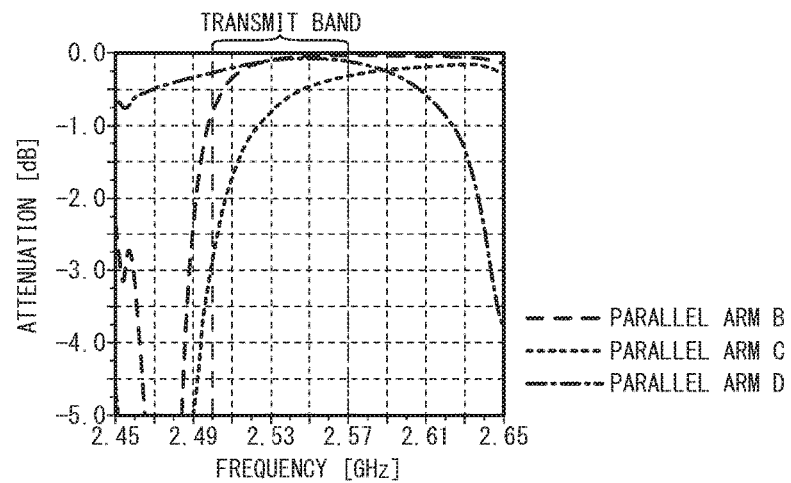
Figure 11C:
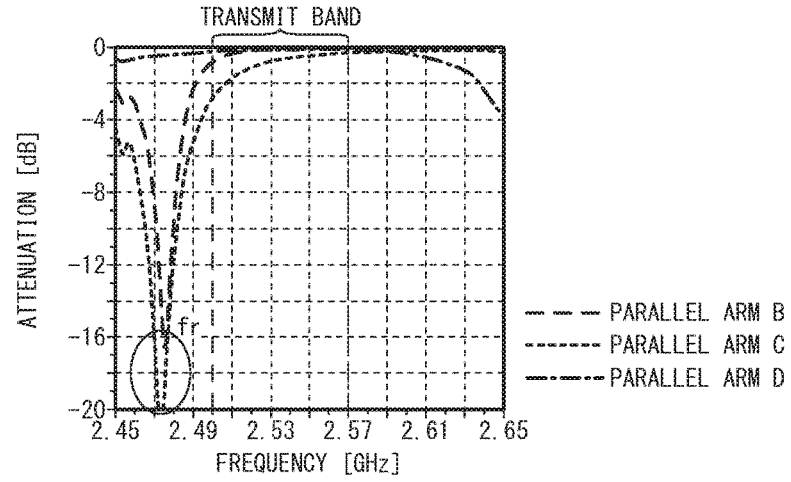

FIG. 11A through FIG. 11C illustrate pass characteristics of the parallel arms B through D. FIG. 11A illustrates pass characteristics from the input terminal Tin to the output terminal Tout in a wide band, FIG. 11B is an enlarged view of the transmit band, and FIG. 11C is an enlarged view of the transmit band and the vicinity of the transmit band.

As illustrated in FIG. 11A through FIG. 11C, in the parallel arm C, an attenuation pole due to the resonant frequency fr is formed as in the parallel arm B, but the attenuation poles AP1 and AP2 are not formed. In the parallel arm D, although the attenuation pole AP2 is formed, the frequency of the attenuation pole due to the resonant frequency fr changes to form the attenuation pole AP1.

As described above, the attenuation poles AP1 and AP2 are not formed without changing the resonant frequency fr unless the parallel resonator PT4 is divided and the inductor L1 is connected to the node N2 between the divided parallel resonators PT41 and PT42.

Figure 12:
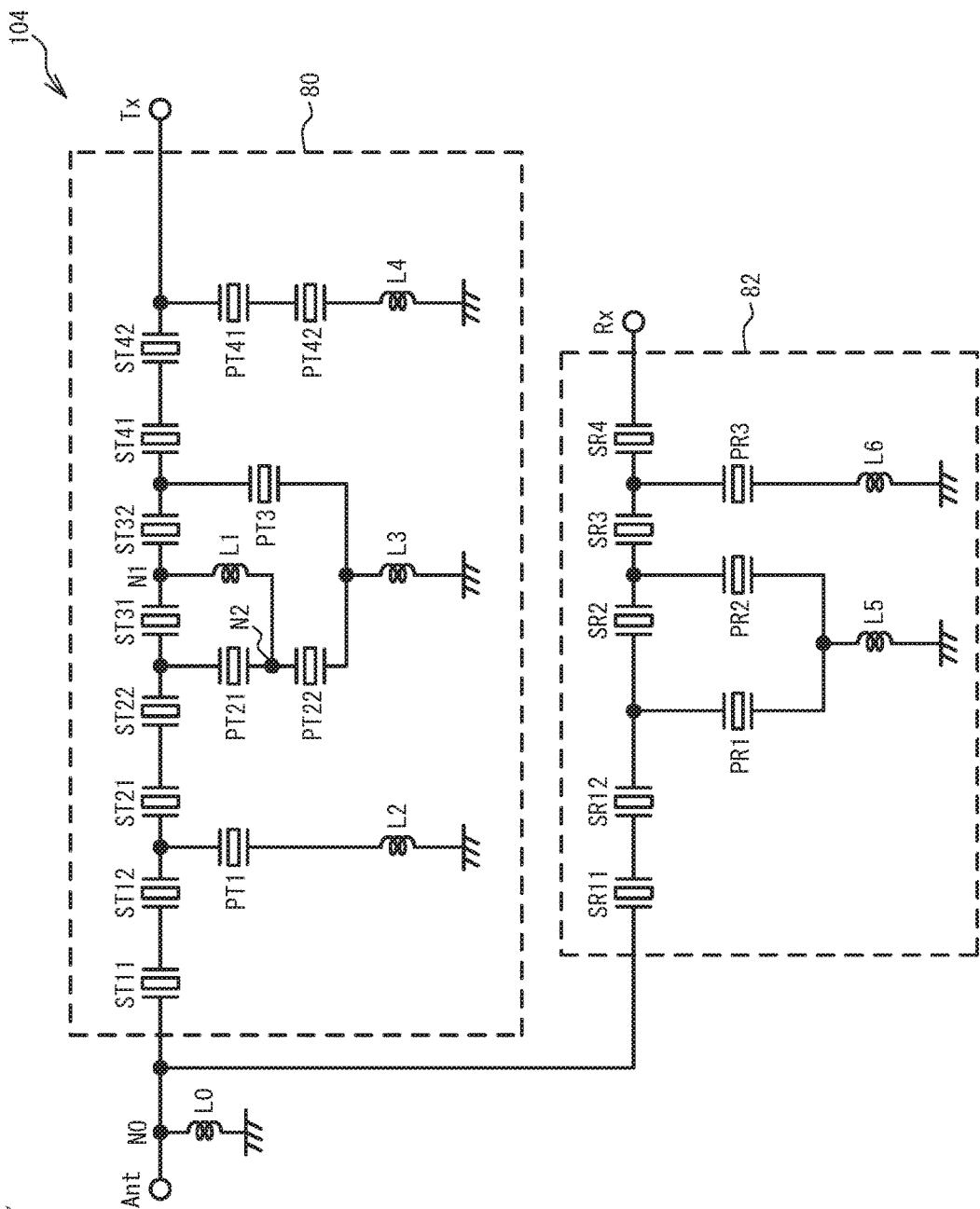
FIG. 12 is a circuit diagram of a duplexer using a filter of a first variation of the first embodiment.

FIG. 12 is a circuit diagram of a duplexer using a filter of a first variation of the first embodiment. As illustrated in FIG. 12, in the transmit filter 80 of a duplexer 104, the inductor L1 is connected between the node N1 between the series resonators ST31 and ST32 and the node N2 between the parallel resonators PT21 and PT22. The inductor L1 has an inductance of 1.0 nH. Other configurations are the same as those of FIG. 2, and the description is omitted.

FIG. 13A through FIG. 14B illustrate pass characteristics from the transmit terminal to the common terminal in the first variation of the first embodiment and the first comparative example. FIG. 14C illustrates isolation characteristics from the transmit terminal to the receive terminal in the first variation of the first embodiment and the first comparative example. FIG. 13A through FIG. 14C correspond to FIG. 3A through FIG. 4C. The solid lines indicate the first variation of the first embodiment, and the dashed lines indicate the first comparative example.

Figure 13A:
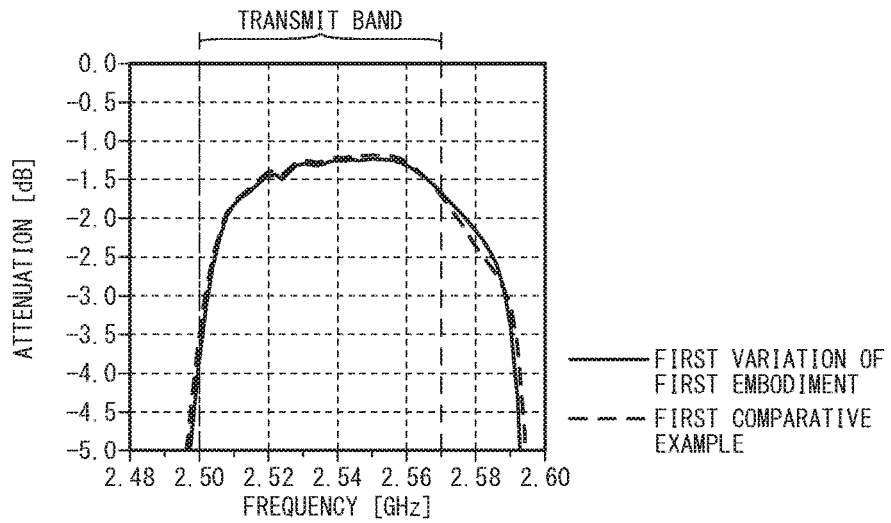
FIG. 13A through FIG. 13C illustrate pass characteristics from the transmit terminal to the common terminal in the first variation of the first embodiment and the first comparative example.
Figure 13B:
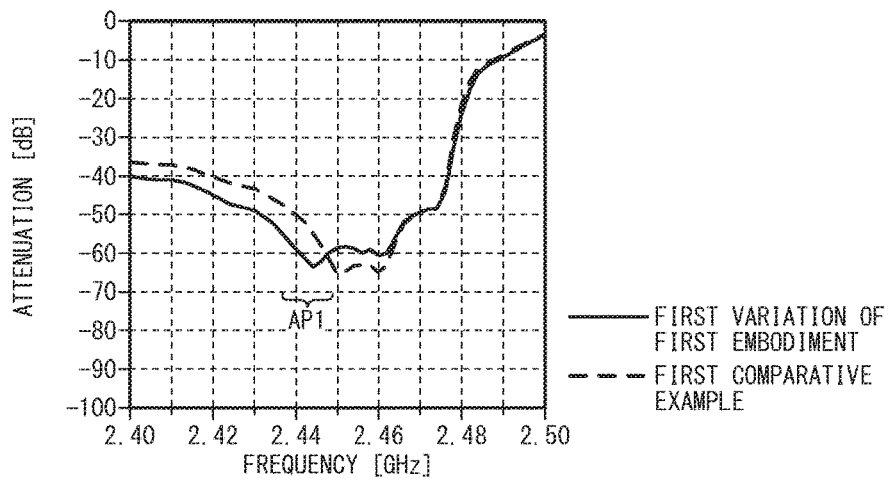
Figure 13C:
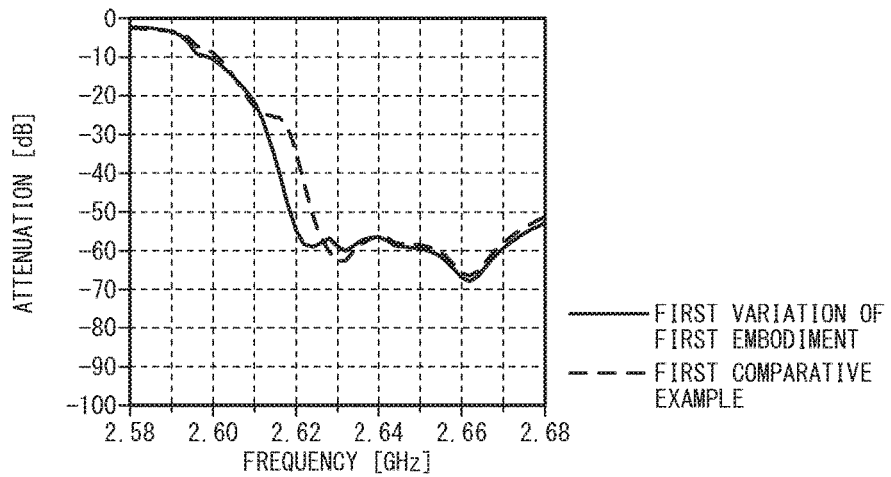
Figure 14A:
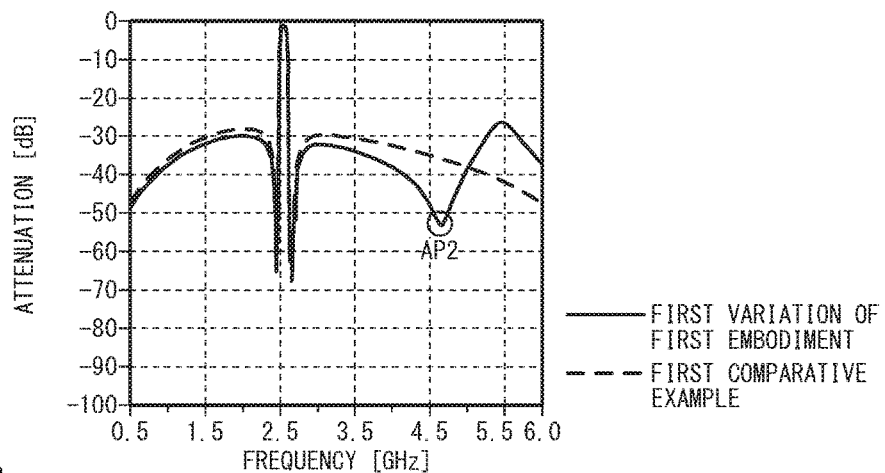
FIG. 14A and FIG. 14B illustrate pass characteristics from the transmit terminal to the common terminal in the first variation of the first embodiment and the first comparative example.
Figure 14B:
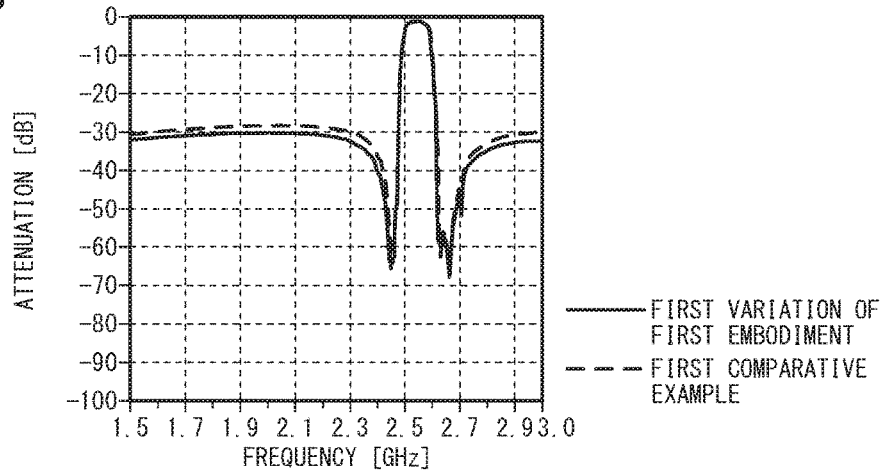
Figure 14C:
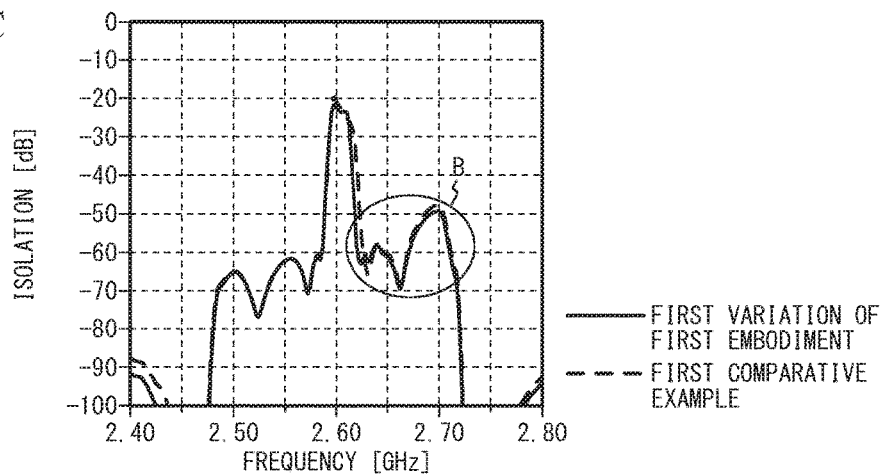
FIG. 14C illustrates isolation characteristics from the transmit terminal to the receive terminal in the first variation of the first embodiment and the first comparative example.

As illustrated in FIG. 13A, the pass characteristics in the transmit band are almost the same between the first variation of the first embodiment and the first comparative example. As illustrated in FIG. 13B, the attenuation pole AP1 is formed around 2.44 GHz. The frequency at which the attenuation pole AP1 is formed is the same as the frequency in the case where the inductance of the inductor L1 is 1.0 nH in FIG. 6B of the first embodiment. As illustrated in FIG. 13C, near frequencies higher than the passband, the attenuation characteristic of the first variation of the first embodiment is slightly better than that of the first comparative example. As illustrated in FIG. 14A, the attenuation pole AP2 is formed around 4.7 GHz. The frequency at which the attenuation pole AP2 is formed is the same as the frequency in the case where the inductance of the inductor L1 is 1.0 nH in FIG. 7A of the first embodiment. As illustrated in FIG. 14C, the isolation characteristics in the vicinity B of the receive band are the same between the first variation of the first embodiment and the first comparative example.

Figure 15A:
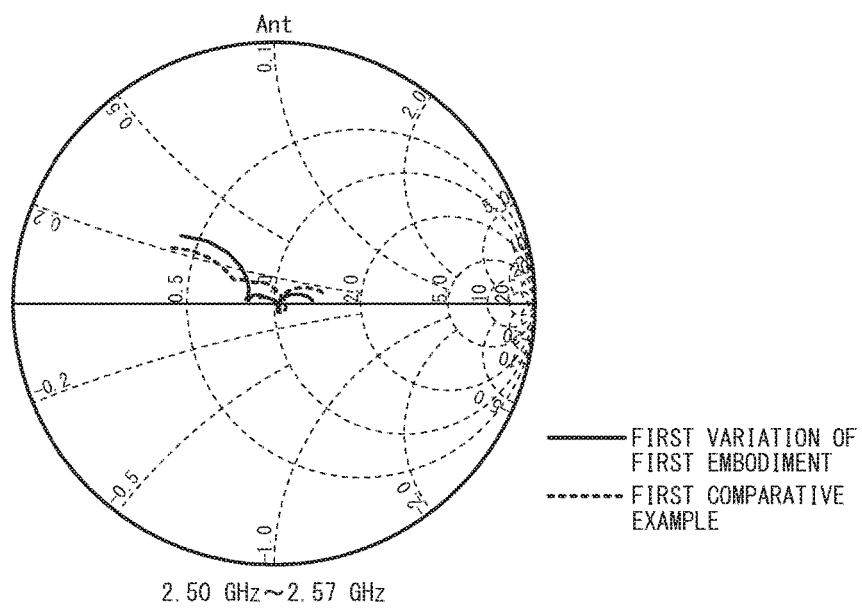
FIG. 15A and FIG. 15B are Smith charts illustrating reflection characteristics in the transmit band in the first variation of the first embodiment and the first comparative example.
Figure 15B:
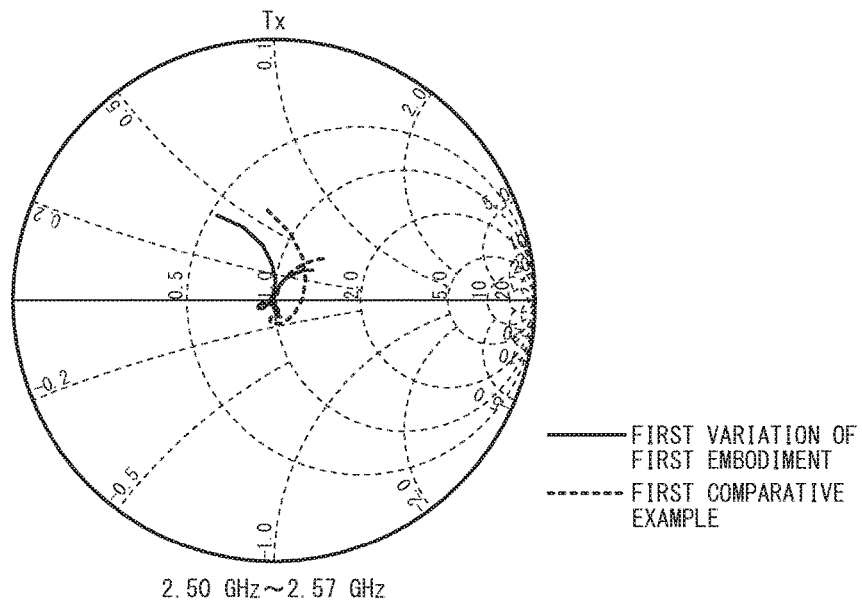

FIG. 15A and FIG. 15B are Smith charts illustrating reflection characteristics in the transmit band in the first variation of the first embodiment and the first comparative example. FIG. 15A and FIG. 15B respectively illustrate reflection characteristics viewed from the common terminal Ant and reflection characteristics viewed from the transmit terminal Tx. The solid lines indicate the first variation of the first embodiment, and the dashed lines indicate the first comparative example. As illustrated in FIG. 15A and FIG. 15B, the reflection characteristics in the transmit band do not greatly differ between the first variation of the first embodiment and the first comparative example. The difference in the reflection characteristics between the first variation of the first embodiment and the first comparative example is slightly greater than the difference between the first embodiment and the first comparative example illustrated in FIG. 5A and FIG. 5B. Especially the difference illustrated in FIG. 15B is slightly greater than the difference illustrated in FIG. 5B.

As described above, the first variation of the first embodiment forms the attenuation pole AP1 with a frequency lower than the transmit band and the attenuation pole AP2 with a frequency higher than the transmit band without deteriorating the pass characteristic of the transmit band and the isolation characteristic compared to the first comparative example. The change in the reflection characteristic in the transmit band is slightly greater than that of the first embodiment, but the reflection characteristic hardly changes even when the inductor L1 is added.

Figure 16:
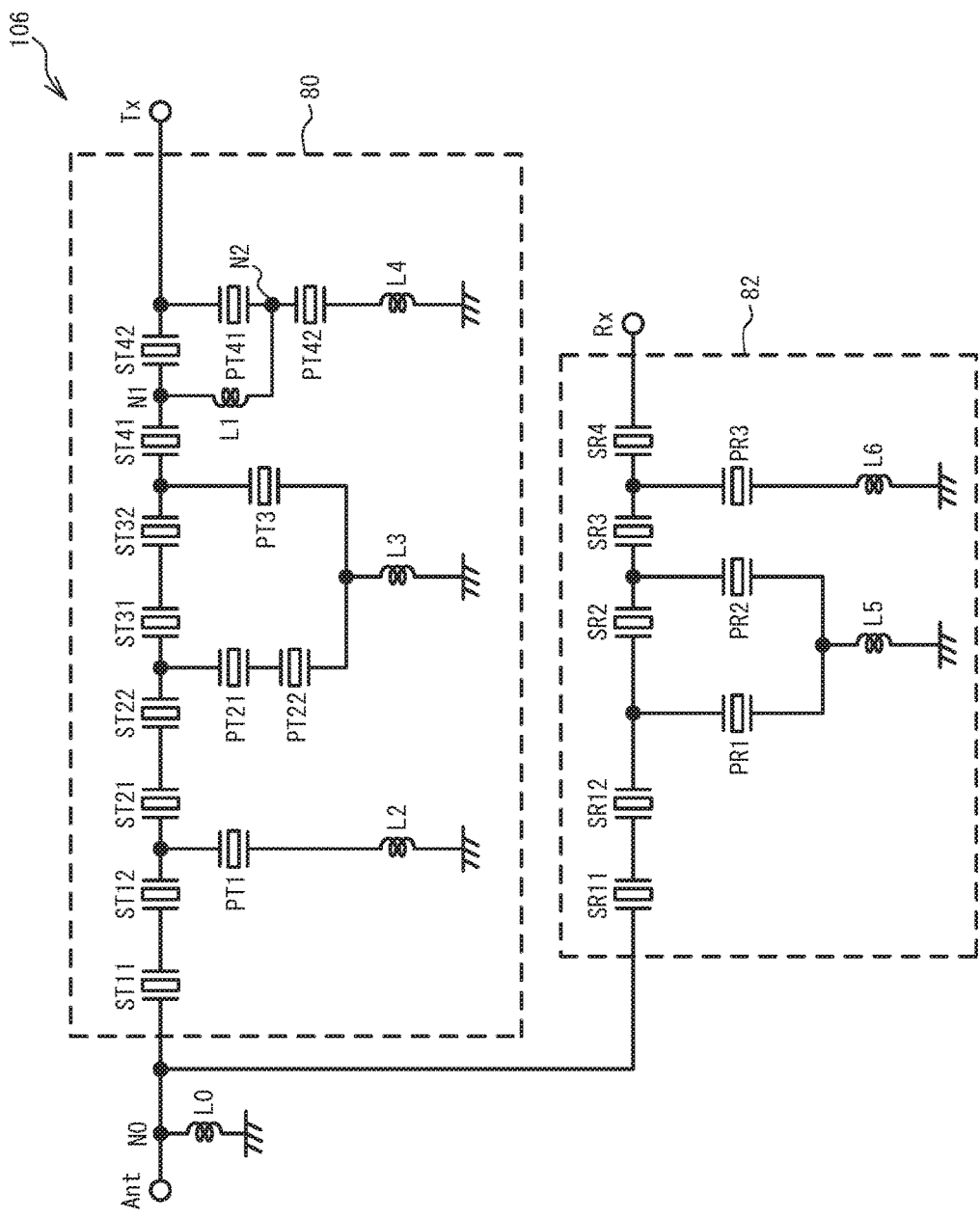
FIG. 16 is a circuit diagram of a duplexer using a filter of a second variation of the first embodiment.

FIG. 16 is a circuit diagram of a duplexer using a filter of a second variation of the first embodiment. As illustrated in FIG. 16, in the transmit filter 80 of a duplexer 106, the inductor L1 is connected between the node N1 between the series resonators ST41 and ST42 and the node N2 between the parallel resonators PT41 and PT42. The inductor L1 has an inductance of 1.0 nH. Other configurations are the same as those of FIG. 2, and the description is omitted.

FIG. 17A through FIG. 18B illustrate pass characteristics from the transmit terminal to the common terminal in the second variation of the first embodiment and the first comparative example. FIG. 18C illustrates isolation characteristics from the transmit terminal to the receive terminal in the second variation of the first embodiment and the first comparative example. FIG. 17A through FIG. 18C respectively correspond to FIG. 3A through FIG. 4C. The solid lines indicate the second variation of the first embodiment, and the dashed lines indicate the first comparative example.

Figure 17A:
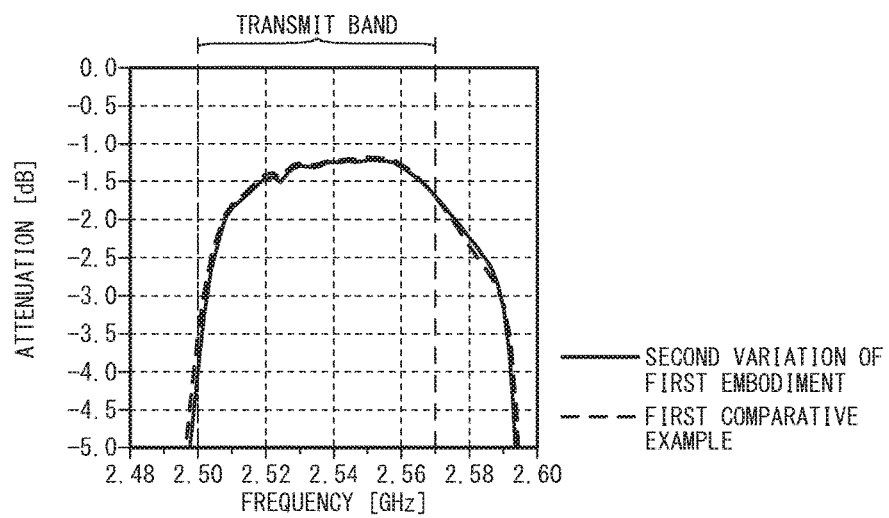
FIG. 17A through FIG. 17C illustrate pass characteristics from the transmit terminal to the common terminal in the second variation of the first embodiment and the first comparative example.
Figure 17B:
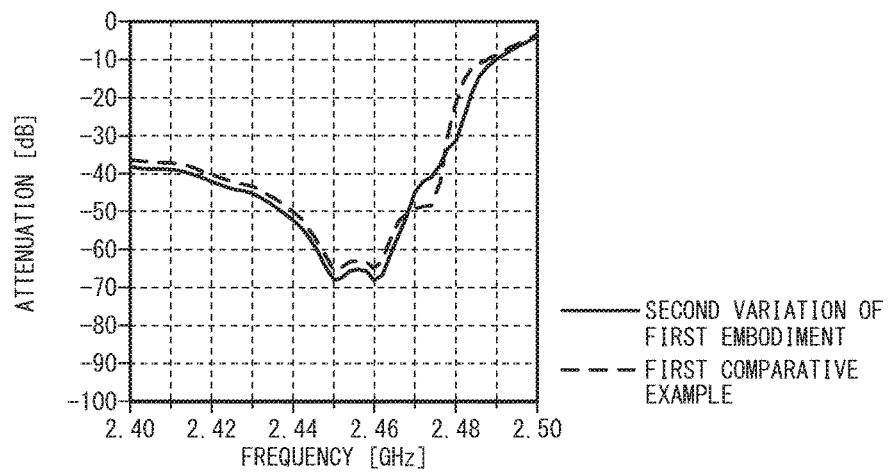
Figure 17C:
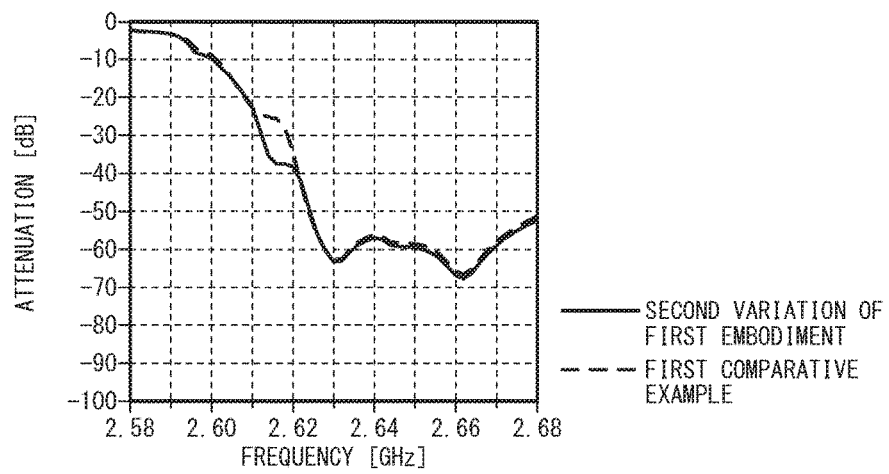
Figure 18A:
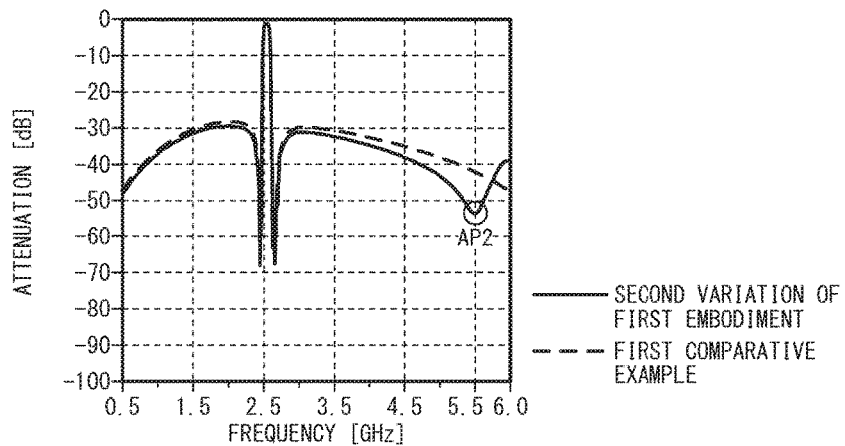
FIG. 18A and FIG. 18B illustrate pass characteristics from the transmit terminal to the common terminal in the second variation of the first embodiment and the first comparative example.
Figure 18B:
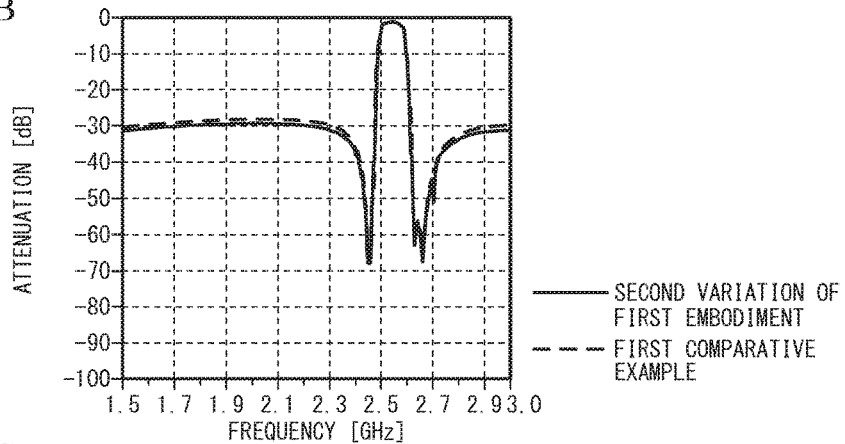
Figure 18C:
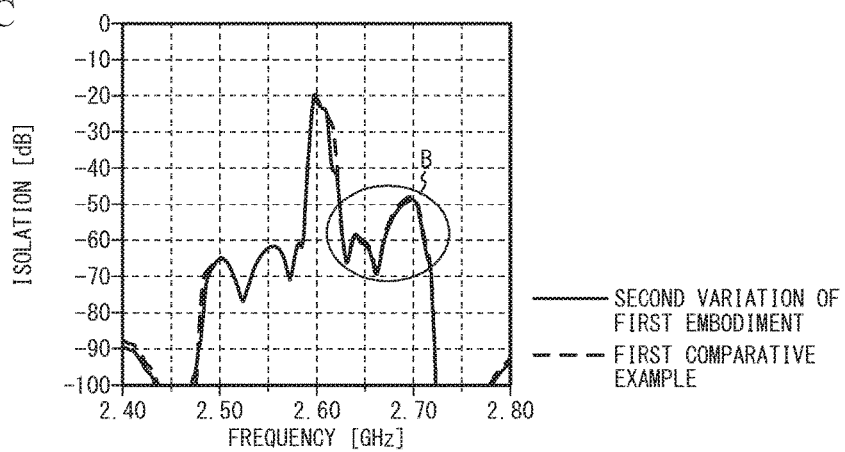
FIG. 18C illustrates isolation characteristics from the transmit terminal to the receive terminal in the second variation of the first embodiment and the first comparative example.

As illustrated in FIG. 17A, the pass characteristics in the transmit band hardly differ between the second variation of the first embodiment and the first comparative example. As illustrated in FIG. 17B and FIG. 17C, the attenuation characteristics around the transmit band hardly differ between the second variation of the first embodiment and the first comparative example. As illustrated in FIG. 18A, the attenuation pole AP2 is formed around 5.5 GHz. As illustrated in FIG. 18C, the isolation characteristics in the vicinity B of the receive band are the same between the second variation of the first embodiment and the first comparative example.

Figure 19A:
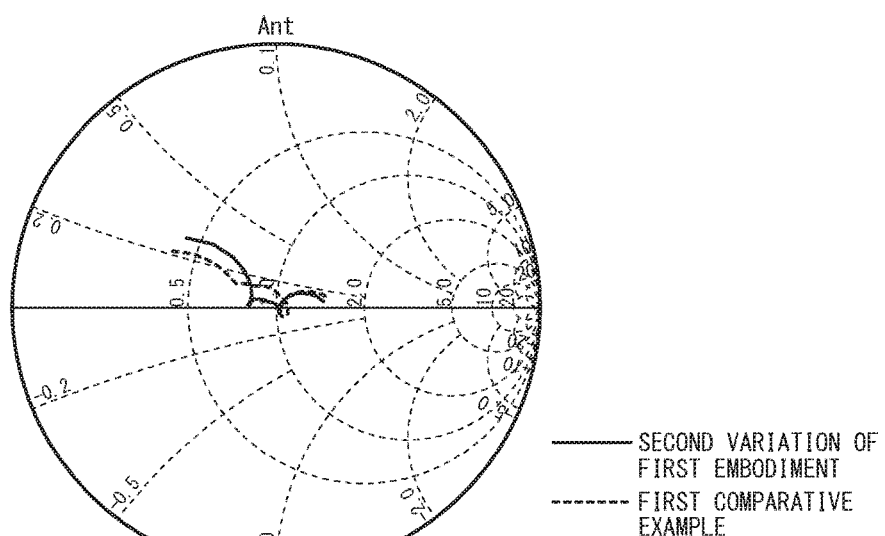
FIG. 19A and FIG. 19B are Smith charts illustrating reflection characteristics in the transmit band in the second variation of the first embodiment and the first comparative example.
Figure 19B:
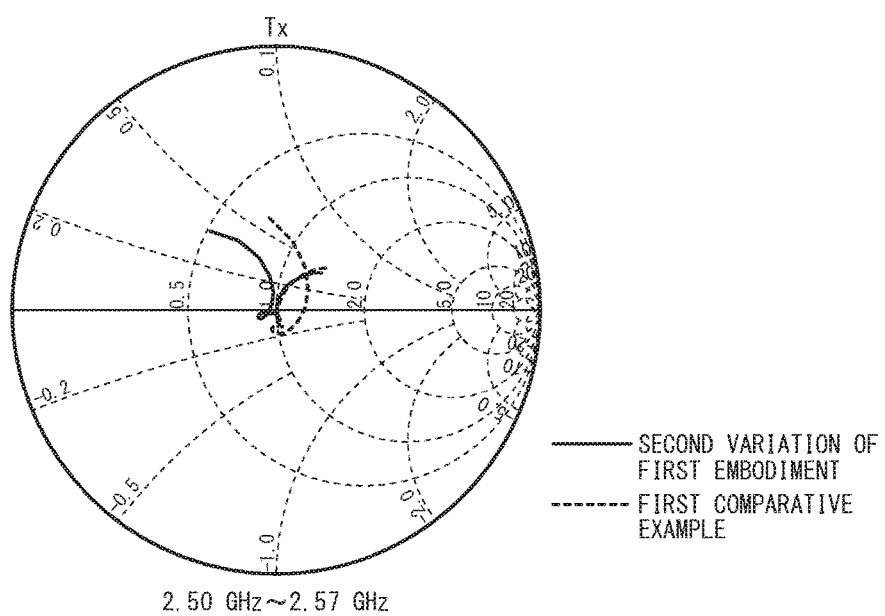

FIG. 19A and FIG. 19B are Smith charts illustrating reflection characteristics in the transmit band in the second variation of the first embodiment and the first comparative example. FIG. 19A and FIG. 19B respectively illustrate reflection characteristics viewed from the common terminal Ant and reflection characteristics viewed from the transmit terminal Tx. The solid lines indicate the second variation of the first embodiment, and the dashed lines indicate the first comparative example. As illustrated in FIG. 19A and FIG. 19B, the reflection characteristics in the transmit band do not greatly differ between the second variation of the first embodiment and the first comparative example. The difference in the reflection characteristics between the second variation of the first embodiment and the first comparative example is slightly greater than the difference between the first embodiment and the first comparative example illustrated in FIG. 5A and FIG. 5B. Especially the difference illustrated in FIG. 19B is slightly greater than the difference illustrated in FIG. 5B.

As described above, the second variation of the first embodiment forms the attenuation pole AP2 with a frequency higher than the passband without deteriorating the pass characteristic of the passband and the isolation characteristic compared to the first comparative example. In FIG. 17B, it is not clear whether the attenuation pole AP1 is formed. However, a small attenuation pole corresponding to the attenuation pole AP1 is considered to be formed. The change in the reflection characteristic in the transmit band is slightly greater than that of the first embodiment, but the reflection characteristic hardly changes even when the inductor L1 is added.

According to the first embodiment and the variations thereof, the first end of the inductor L1 is coupled to the node N1 that is located in the path from the transmit terminal Tx (an input terminal) to the common terminal Ant (an output terminal) through the series resonators ST11 through ST42. The second end of the inductor L1 is coupled to the node N2 located between the divided parallel resonators PT41 and PT42. This configuration allows the steep attenuation poles AP1 and AP2 without deteriorating the pass characteristic of the passband (the transmit band in the first embodiment and the variations thereof) and the isolation characteristic. This is considered to be because the attenuation poles AP1 and AP2 are formed without changing the resonant frequency fr of the parallel resonator as described in the parallel arms A through D. The positions of the attenuation poles AP1 and AP2 are configured by inductance.

The first embodiment and the variations thereof have described a case where one inductor L1 is provided. However, each of two or more parallel resonators may be divided, and the inductor L1 may be located so as to correspond to each of the divided parallel resonators. At this time, two or more inductors L1 may have the same inductance or different inductances.

When the first embodiment is compared to the first variation of the first embodiment, the change in the reflection characteristic in the transmit band of the first embodiment is less than that of the first variation. Thus, the parallel resonator to which the inductor L1 is coupled is preferably at least one of a parallel resonator closest to the input terminal (the transmit terminal Tx) and a parallel resonator closest to the output terminal (the common terminal Ant). The resonator is often divided at the input terminal side to which large electrical power is applied. Thus, the parallel resonator to which the inductor L1 is coupled is preferably the parallel resonator closest to the input terminal.

When the first embodiment is compared to the second variation of the first embodiment, the change in the reflection characteristic in the passband of the first embodiment is less than that of the second variation. Thus, the node N1 is preferably a node between the input terminal (the transmit terminal Tx) and the divided parallel resonators PT41 and PT42. When the inductor L1 is connected to a parallel resonator closest to the output terminal, the node N1 is preferably a node between the output terminal and divided parallel resonators.

As described in the first embodiment, no series resonator may be connected between the node N1 and the divided parallel resonators PT41 and PT42. As described in the second variation of the first embodiment, the series resonator ST42 may be connected between the node N1 and the parallel resonators PT41 and PT42. The series resonator between the node N1 and the parallel resonators PT41 and PT42 may be one of the divided series resonators, or may be a series resonator that is not divided. According to the comparison between the first embodiment and the first and second variations of the first embodiment, no series resonator is preferably connected between the node N1 and divided parallel resonators.

None of remaining parallel resonators, which are not divided, of two or more parallel resonators is preferably connected between the node N1 and the divided parallel resonators.

The number of the series resonators and the number of the parallel resonators may be selected depending on the purpose. The series resonator and the parallel resonator may be divided depending on the purpose. Although the case where the parallel resonator is divided into two has been described, the parallel resonator may be divided into three or more. The divided parallel resonators may have different capacitance values, or may have almost the same capacitance value.

Although the case where the filter of the first embodiment is the transmit filter 80 has been described, the filter of the first embodiment may be at least one of the transmit filter 80 and the receive filter 82. The resonator is often divided in the transmit filter 80 to which large electrical power is applied. Therefore, the filter of the first embodiment is preferably applied to the transmit filter 80.

Second Embodiment

Figure 20:
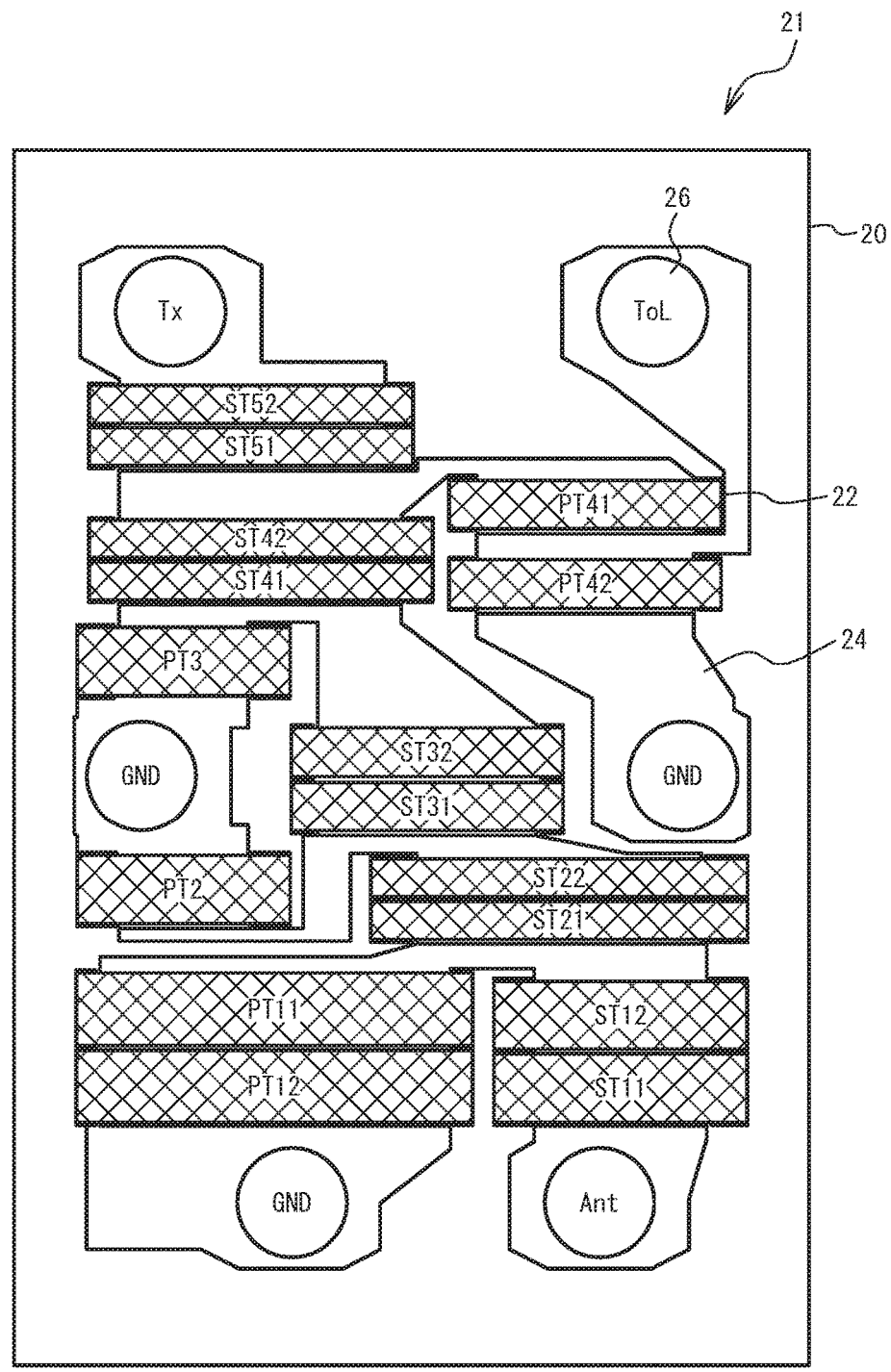
FIG. 20 is a plan view of a filter chip in which a filter used in a second embodiment is formed.

A second embodiment is an example in which the filters of the first embodiment and the variations thereof are mounted on a substrate. FIG. 20 is a plan view of a filter chip in which a filter used for the second embodiment is formed. As illustrated in FIG. 20, a filter chip 21 includes a substrate 20. The substrate 20 is a piezoelectric substrate such as a lithium tantalate substrate or a lithium niobate substrate. Formed on the substrate 20 are a surface acoustic wave resonator 22, a metal layer 24, and bumps 26. The metal layer 24 forms, for example, wiring lines such as copper wiring lines, gold wiring lines, or aluminum wiring lines. The bumps 26 are, for example, gold bumps or solder bumps, and correspond to a transmit terminal Tx, an additional terminal ToL, a common terminal Ant, and a ground terminal GND. Series resonators ST11 through ST52 are connected in series between the common terminal Ant and the transmit terminal Tx through the metal layer 24 (wiring lines). Parallel resonators PT11 through PT42 are connected in parallel between the common terminal Ant and the transmit terminal Tx through the metal layer 24 (wiring lines). The additional terminal ToL is connected between the divided parallel resonators PT41 and PT42.

Figure 21:
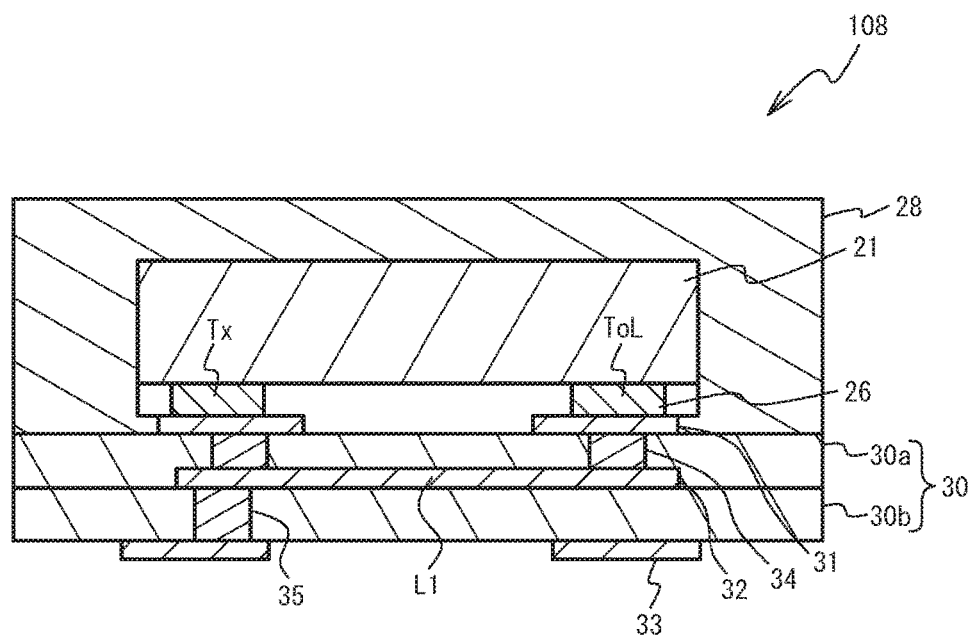
FIG. 21 is a cross-sectional view of an acoustic wave device in accordance with a second embodiment.

FIG. 21 is a cross-sectional view of an acoustic wave device in accordance with the second embodiment. As illustrated in FIG. 21, an acoustic wave device 108 includes the filter chip 21, a multilayered substrate 30, and a sealing portion 28. The multilayered substrate 30 includes stacked insulating layers 30a and 30b. The insulating layers 30a and 30b are, for example, resin layers or ceramic layers. An electrode 31 is formed on the upper surface of the insulating layer 30a. A wiring line 32 is formed on the upper surface of the insulating layer 30b. Foot pads 33 are formed on the lower surface of the insulating layer 30b. Via wirings 34 and 35 respectively penetrating through the insulating layers 30a and 30b are formed. The electrode 31, the wiring line 32, the foot pads 33, and the via wirings 34 and 35 are formed of a metal layer such as, for example, a copper layer, a gold layer, or an aluminum layer. The bumps 26 are bonded on the electrode 31 to flip-chip mount the filter chip 21 on the multilayered substrate 30. The filter chip 21 is sealed by the sealing portion 28. The sealing portion 28 is formed of, for example, a metal such as solder or an insulating material such as a resin. An air gap is formed between the filter chip 21 and the multilayered substrate 30.

In the second embodiment, the wiring line 32 is electrically connected between the transmit terminal Tx and the additional terminal ToL through the via wiring 34. As described in the second embodiment, the inductor L1 may be formed with the wiring line 32.

Figure 22:
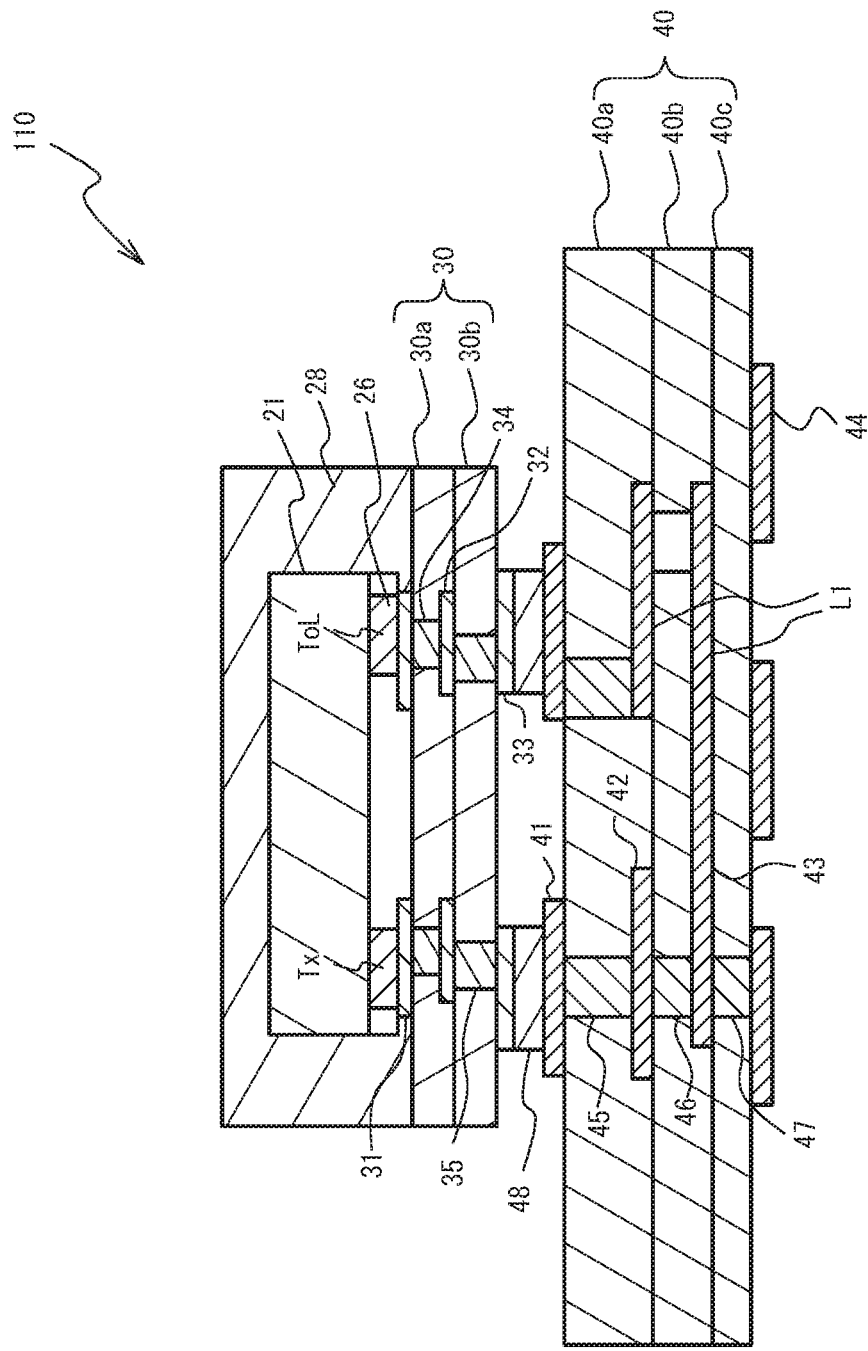
FIG. 22 is a cross-sectional view of an acoustic wave device in accordance with a first variation of the second embodiment.

FIG. 22 is a cross-sectional view of an acoustic wave device in accordance with a first variation of the second embodiment. In an acoustic wave device 110, the filter chip 21 mounted on the multilayered substrate 30 is mounted on a PCB (Print Circuit Board) 40. The PCB 40 includes two or more stacked insulating layers 40a through 40c. The insulating layers 40a through 40c are, for example, resin layers. An electrode 41 is formed on the upper surface of the insulating layer 40a. A wiring line 42 is formed on the upper surface of the insulating layer 40b, and a wiring line 43 is formed on the upper surface of the insulating layer 40c. Foot pads 44 are formed on the lower surface of the insulating layer 40c. Via wirings 45 through 47 respectively penetrating through the insulating layers 40a through 40c are formed. The electrode 41, the wiring lines 42 and 43, the foot pads 44, and the via wirings 45 through 47 are formed of a metal layer such as, for example, a copper layer, a gold layer, or an aluminum layer. The electrode 41 is bonded to the foot pad 33 by solder 48 to mount the multilayered substrate 30 on the PCB 40.

In the first variation of the second embodiment, the transmit terminal Tx is not electrically connected to the additional terminal ToL in the multilayered substrate 30. In the PCB 40, the transmit terminal Tx is electrically connected to the additional terminal ToL through the wiring lines 42 and 43. As described in the first variation of the second embodiment, the inductor L1 may be formed with the wiring lines 42 and 43 in the PCB 40.

Figure 23:
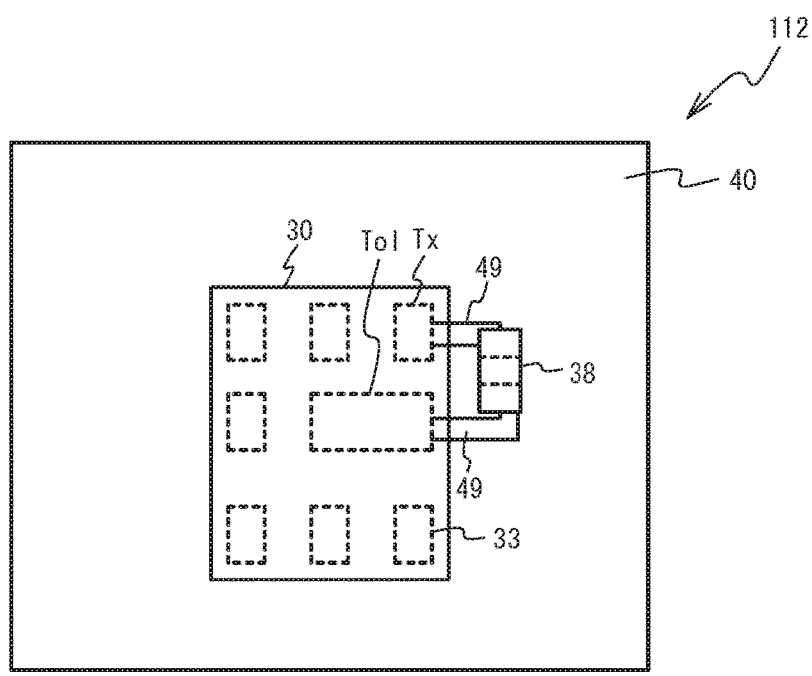
FIG. 23 is a plan view of an acoustic wave device in accordance with a second variation of the second embodiment.

FIG. 23 is a plan view of an acoustic wave device in accordance with a second variation of the second embodiment. FIG. 23 is a plan view of the upper surface of the PCB 40 on which the multilayered substrate 30 and a chip inductor 38 are mounted. In an acoustic wave device 112, the foot pads 33 are illustrated by omitting the multilayered substrate 30. A wiring line 49 is formed on the upper surface of the PCB 40. The chip inductor 38 is electrically connected to the foot pads 33 corresponding to the transmit terminal Tx and the additional terminal ToL through the wiring lines 49. As described in the second variation of the second embodiment, the inductor L1 may be formed with a chip inductor.

As described in the second embodiment and the first variation of the second embodiment, the inductor L1 may be formed in a substrate such as the multilayered substrate 30 on which the filter chip 21 is mounted or the PCB substrate 40. As described in the second variation of the second embodiment, the inductor L1 may be a chip component mounted on a substrate such as the multilayered substrate 30 on which the filter chip 21 is mounted or the PCB substrate 40.

Third Embodiment

Figure 24:
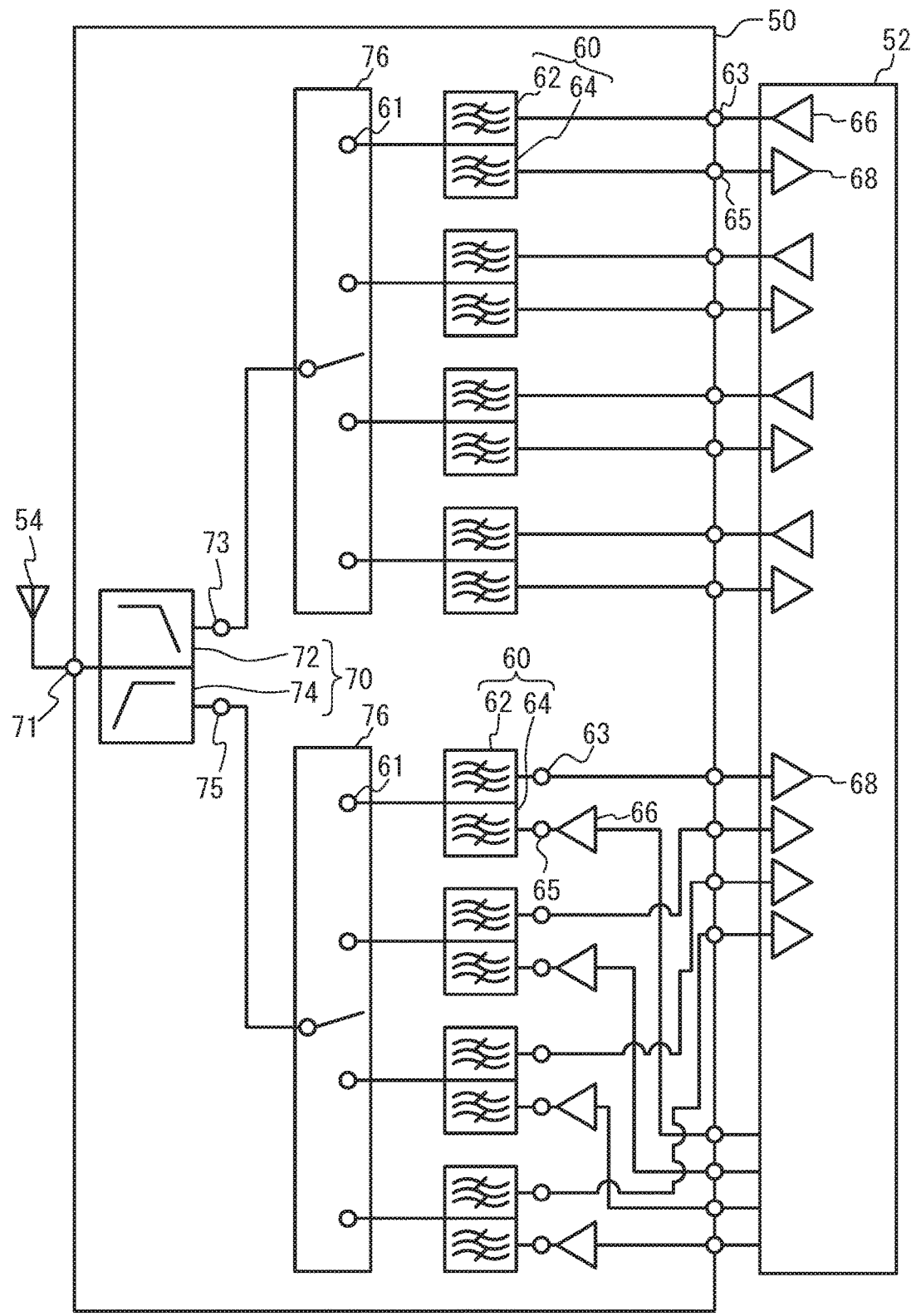
FIG. 24 is a block diagram of a system including a module in accordance with a third embodiment.

A third embodiment is an exemplary module including any one of the ladder-type filters of the first and second embodiments. FIG. 24 is a block diagram of a system including a module in accordance with the third embodiment. As illustrated in FIG. 24, the system includes a module 50, an integrated circuit 52, and an antenna 54. The module 50 includes a diplexer 70, switches 76, duplexers 60, and power amplifiers 66. The diplexer 70 includes a low-pass filter (LPF) 72 and a high-pass filter (HPF) 74. The LPF 72 is connected between terminals 71 and 73. The HPF 74 is connected between terminals 71 and 75. The terminal 71 is coupled to the antenna 54. The LPF 72 passes low-frequency signals of signals transmitted/received from the antenna 54, and suppresses high-frequency signals. The HPF 74 passes high-frequency signals of signals transmitted/received from the antenna 54, and suppresses low-frequency signals.

The switch 76 connects the terminal 73 to one of two or more terminals 61. The duplexer 60 includes a transmit filter 62 and a receive filter 64. The transmit filter 62 is connected between terminals 61 and 63. The receive filter 64 is connected between terminals 61 and 65. The transmit filter 62 passes signals within the transmit band, and suppresses other signals. The receive filter 64 passes signals within the receive band, and suppresses other signals. The power amplifier 66 amplifies and outputs transmission signals to the terminal 63. A low noise amplifier 68 amplifies reception signals output to the terminal 65.

The filters of the first and second embodiments may be used for at least one of the transmit filter 62 and the receive filter 64 of the duplexer 60. The third embodiment describes a front end module for mobile communication terminals as an example of a module, but the module may be other kinds of modules.

The first embodiment and its variations mainly describe a surface acoustic wave resonator as an example of a resonator, but the resonator may be a boundary acoustic wave resonator, a Love wave resonator, or a piezoelectric thin film resonator.

Although the embodiments of the present invention have been described in detail, it is to be understood that the various change, substitutions, and alterations could be made hereto without departing from the spirit and scope of the invention.

What is claimed is:

1. A ladder-type filter comprising:
one or more series resonators connected in series between an input terminal and an output terminal;
one or more parallel resonators connected in parallel between the input terminal and the output terminal;
divided parallel resonators formed by serially dividing at least one parallel resonator of the one or more parallel resonators; and
an inductor of which a first end is coupled to a first node located in a path from the input terminal to the output terminal through the one or more series resonators, and of which a second end is coupled to a second node located between the divided parallel resonators.

2. The ladder-type filter according to claim 1, wherein the at least one parallel resonator is at least one of a parallel resonator closest to the input terminal and a parallel resonator closest to the output terminal.

3. The ladder-type filter according to claim 2, wherein the first node is at least one of a node between the input terminal and the at least one parallel resonator and a node between the output terminal and the at least one parallel resonator.

4. The ladder-type filter according to claim 1, wherein no series resonator is connected between the first node and the at least one parallel resonator.

5. The ladder-type filter according to claim 1, wherein none of a remaining parallel resonator, which is not divided, of the one or more parallel resonators is connected between the first node and the at least one parallel resonator.

6. The ladder-type filter according to claim 1, wherein the divide parallel resonators have approximately equal capacitance values.

7. The ladder-type filter according to claim 1, further comprising:
a filter chip including the one or more series resonators and the one or more parallel resonators formed therein; and
a substrate on which the filter chip is mounted,
wherein the inductor is a chip component mounted on the substrate.

8. The ladder-type filter according to claim 1, further comprising:
a filter chip including the one or more series resonators and the one or more parallel resonators formed therein; and
a substrate on which the filter chip is mounted,
wherein the inductor is formed in the substrate.

9. A duplexer comprising:
a transmit filter connected between a transmit terminal and a common terminal; and
a receive filter connected between a receive terminal and the common terminal,
wherein at least one of the transmit filter and the receive filter is the ladder-type filter according to claim 1.

10. A module comprising:
the ladder-type filter according to claim 1.

11. The ladder-type filter according to claim 1, wherein the at least one parallel resonator is at least one of a parallel resonator closest to the input terminal in terms of electrical connection and a parallel resonator electrically closest to the output terminal in terms of electrical connection.

* * * * *